(12) United States Patent
Nakajima

(10) Patent No.: US 6,693,348 B2
(45) Date of Patent: Feb. 17, 2004

(54) SEMICONDUCTOR DEVICE WITH POWER SUPPLYING UNIT BETWEEN A SEMICONDUCTOR CHIP AND A SUPPORTING SUBSTRATE

(75) Inventor: Mitsuru Nakajima, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/171,536

(22) Filed: Jun. 17, 2002

(65) Prior Publication Data
US 2003/0011055 A1 Jan. 16, 2003

(30) Foreign Application Priority Data
Jun. 15, 2001 (JP) .................................... 2001-182261

(51) Int. Cl.⁷ ............................................... H01L 23/14
(52) U.S. Cl. ........................ 257/691; 257/713; 257/783
(58) Field of Search ................................ 257/691, 713, 257/735, 737, 778, 783; 438/118

(56) References Cited

U.S. PATENT DOCUMENTS

| | | | | |
|---|---|---|---|---|
| 3,972,062 A | * | 7/1976 | Hopp | 257/778 |
| 5,016,138 A | * | 5/1991 | Woodman | 361/688 |
| 5,426,563 A | * | 6/1995 | Moresco et al. | 361/689 |
| 5,475,568 A | * | 12/1995 | Umesato | 361/784 |
| 6,072,240 A | * | 6/2000 | Kimura et al. | 257/735 |
| 6,396,043 B1 | * | 5/2002 | Glenn et al. | 250/208.1 |
| 6,476,330 B2 | * | 11/2002 | Otsuka et al. | 174/261 |
| 6,518,096 B2 | * | 2/2003 | Chan et al. | 438/118 |

FOREIGN PATENT DOCUMENTS

| | | | | |
|---|---|---|---|---|
| JP | 5-218230 A | | 8/1993 | |
| JP | 2000-111617 A | * | 4/2000 | G01R/31/28 |

OTHER PUBLICATIONS

U.S. patent application Ser. No. 10/171,536, Nakajima, filed Jun. 17, 2002.
U.S. patent application Ser. No. 10/396,973, Nakajima et al., filed Mar. 24, 2003.

* cited by examiner

Primary Examiner—Carl Whitehead, Jr.
Assistant Examiner—Stephen W. Smoot
(74) Attorney, Agent, or Firm—Oblon, Spivak, McClelland, Maier & Neustadt, P.C.

(57) ABSTRACT

A semiconductor device in which a breakage of contacting point by thermal expansion is prevented, an image scanning unit utilizing the same and an image forming apparatus utilizing the same, is disclosed. The semiconductor device includes an assembly 100 in which a semiconductor chip 2 having a functional surface 2a and a power supplying means 5 are electrically connected at the functional surface 2a, and is characterized in the assembly is disposed on a substrate 1 with the power supplying means 5 side being the substrate side, and the substrate 1 and the assembly 100 are fixed together at a portion other than the power supplying means 5 portion.

40 Claims, 10 Drawing Sheets

SEMICONDUCTOR DEVICE WITH POWER SUPPLYING UNIT BETWEEN A SEMICONDUCTOR CHIP AND A SUPPORTING SUBSTRATE

BACKGROUND OF THE INVENTION

1. Field of the Invention

The present invention relates to a semiconductor device in which a contacting point breakage of electrical bonding can be prevented, and to an image scanning unit utilizing the same and an image forming apparatus utilizing the same.

2. Description of the Prior Art

In the prior art technology a wireless bonding is well known, which has advantages in a higher densification of the contact pins and a miniaturization of the semiconductor device by means of connection of a large number of pins which are the contacting point of semiconductor chip onto the contacting points of a substrate when in comparison with the wire bonding in which the bonding pads on the semiconductor chip and the lead on the substrate are connected electrically with the metal fine line.

It is also well known that there is a face down bonding as one of the wireless bonding technology. This face down bonding is a method in that a bump or a beam lead is formed on a bonding pad of the semiconductor chip and the semiconductor chip is directly connected with its chip surface onto a conductor layer of the substrate by putting it with the chip surface down.

As a typical face down bonding method, there is a method called flip chip.

Because there is recently a requirement for miniaturization of semiconductor devices, it has been popular to achieve the semiconductor chip face down bonding with the substrate as a method for further miniaturization of a package of the semiconductor chip and the substrate.

When a semiconductor chip is achieved a face down bonding onto a substrate, it is also well known that a means is employed to prevent a breakage in the circuit, for example, caused by the thermal expansion by means that an adhesive material is used (as a sealing compound) between the semiconductor chip and the substrate in order to prevent an occurrence of a electrical breakage (at contacting point) in a circuit which is caused by a difference in the coefficients of thermal expansion between the semiconductor chip and the substrate.

The thermal expansion generally becomes large in proportion to a difference in temperature and a length of the object. An amount of the expansion is dependent on a coefficient which is different in accordance with the material of object, namely, a coefficient of thermal expansion. Because of the above described reason in an object with longer length such as a line CCD which is used in a copy machine, facsimile, scanner and so on, an amount of the thermal expansion especially along a longer direction becomes extremely large.

Due to this fact even when the adhesive material (sealing compound) is used between the semiconductor chip and the substrate as described above, the electrical contacting point are relatively moved because the difference between the amount of thermal expansion is too large. As a result of this, there was a problem that the contacting point between the semiconductor chip and the substrate was broken.

In the past a semiconductor chip has been well known in that the semiconductor chip and the substrate were covered with a resin which was disclosed in the Japanese Laid Open Patent Hei 05-218230. In this semiconductor chip a semiconductor chip which is mounted with a flip chip structure is covered with a resin, However, there is a problem in the method disclosed in the Japanese Laid Open Patent Hei 06-218230 that the thermal expansion is accelerated because even a back surface of the functional surface of semiconductor chip is also covered with the resin, and thereby a place from which heat generated by high speed driving of the semiconductor chip is radiated, is also covered with resin too, the method can not prevent effectively the breakage of contacting point by the thermal expansion. Especially a significant effect is shown in the semiconductor chip with longer length.

SUMMARY OF THE INVENTION

Because of the above described situation an object of the present invention is to provide a semiconductor chip in which a contacting point breakage of electrical bonding can be prevented, and to provide an image scanning unit utilizing the same and an image forming apparatus utilizing the same.

Another object of the present invention is to provide a semiconductor chip in which a curvature of the semiconductor chip with the optical functional surface by the thermal expansion can be prevented to forbid an occurrence of out of focus, and to provide an image scanning unit utilizing the same and an image forming apparatus utilizing the same.

To achieve the above described objects the present invention provides a semiconductor device including: a semiconductor chip which has a functional surface; a power supplying means which is connected to the functional surface; and a substrate which supports the semiconductor chip and the power supplying means, wherein the semiconductor chip is fixed on the substrate at portion other than a connecting potion between the functional surface and the power supplying means.

A 1st feature of the present invention is a semiconductor device including an assembly in which a semiconductor chip having a functional surface and a power supplying means are electrically connected at the functional surface, characterized by that the assembly is disposed on a substrate with the power supplying means side being the substrate side, and the substrate and the assembly are fixed together at a portion other than the power supplying means portion.

In this structure a pinched portion of the power supplying means is free from the movement of substrate because the substrate and the assembly are fixed through portions other than power supplying means when the substrate and the semiconductor chip make an expansion and contraction in different amount under an influence of heat. Accordingly any stress does not affect on the contacting portion between the power supplying means and the semiconductor chip thereby a breakage of the assembled portion can be prevented.

A 2nd feature of the present invention is a semiconductor device including an assembly in which a semiconductor chip having a functional surface at a front surface and a power supplying means are electrically connected at the functional surface, characterized by that the assembly is disposed on a substrate with the power supplying means side being the substrate side, the power supplying means has a pinched portion between the semiconductor device and the substrate, and the substrate and the semiconductor device are fixed together at a portion other than the pinched portion.

In this structure a pinched portion of the power supplying means is free from the movement of substrate because at least pinched portion of the power supplying means moves integratedly with the semiconductor chip and the pinched portion is not fixed on the substrate when the substrate and the semiconductor chip make an expansion and contraction in different amount under an influence of heat. Accordingly any stress does not affect on the contacting portion between the power supplying means and the semiconductor chip thereby a breakage of the assembled portion can be prevented.

A 3rd feature of the present invention is the semiconductor device according to the 2nd feature and characterized by that an adhesive material which adheres the semiconductor chip and the substrate to fix, is filled at a space between the substrate and the functional surface of the semiconductor chip In this structure in addition to an action by the above described 2nd feature, because the stress caused by the thermal expansion and contraction between the semiconductor chip and the substrate is not concentrated to specific region and the stress is absorbed in entire structure, thereby the local breakage of semiconductor chip and substrate can be prevented.

A 4th feature of the present invention is the semiconductor device according to the above described 2nd feature and characterized by that the adhesive material which adheres the semiconductor chip and the substrate to fix, adheres them with contacting the substrate and a back surface of the semiconductor chip. In this structure in addition to an action by the above described 2nd feature, because the stress caused by the thermal expansion and contraction between the semiconductor chip and the substrate is not concentrated to specific region and the stress is absorbed in entire structure, thereby the local breakage of semiconductor chip and substrate can be prevented.

And at the same time the adhesive material does not contact with a functional surface of the semiconductor chip and the above described problems are solved that the adhesive material becomes an invisible electrical circuit and it can not perform its desired function because it works as a capacitor with a harmful parasitic capacitance and that adhesive material block off the light path because it wraparound the light accepting surface (or the light emitting surface).

A 5th feature of the present invention is the semiconductor device according to the above described 2nd feature and characterized by that the adhesive material which adheres the semiconductor chip and the substrate to fix, adheres them on at least one surface other than both of a front surface and the back surface of the semiconductor chip. In this structure in addition to an action by the above described 2nd feature, because the stress caused by the thermal expansion and contraction between the semiconductor chip and the substrate is not concentrated to specific region and the stress is absorbed in entire structure, thereby the local breakage of semiconductor chip and substrate can be prevented.

And at the same time the adhesive material does not contact with a functional surface of the semiconductor chip and the above described problems are solved that the adhesive material becomes an invisible electrical circuit and it can not perform its desired function because it works as a capacitor with a harmful parasitic capacitance and that adhesive material block off the light path because it wraparound the light accepting surface (or the light emitting surface).

A 6th feature of the present invention is the semiconductor device according to the above described 5th feature and characterized by that the adhesive material is covered with adhesive material which has been cured. In this structure in addition to the action by the above described 5th feature a flowing out of the adhesive material is cleared and thereby it is prevented that the flown out adhesive material enters into a space between the functional surface of the semiconductor chip and the substrate. Also the initial shape of the adhesive material is kept and thereby disposition of the adhesive material becomes easier.

A 7th feature of the present invention is the semiconductor device according to the above described 6th feature and characterized by that a cross section of the adhesive material is a circular. In this structure in addition to the action by the above described 6th feature strength can be given to the adhesive material against to the internal and external pressure before the adhesive material is cured.

An 8th feature of the present invention is the semiconductor device according to the above described the 6th feature and characterized by that a cross section of the adhesive material is a polygonal. In this structure the adhesive strength can be made higher because an adhering area between the adhesive material and the semiconductor chip and the substrate can be took wider.

A 9th feature of the present invention is the semiconductor device according to the above described the 5th feature and characterized by that the adhesive material is held by an adhesive material holding means. In this structure in addition to the action by the above described 5th feature the adhesive material would not wraparound between the functional surface of semiconductor and the substrate because the flowing out of adhesive material can be prevented effectively even when the adhesive material with low viscosity is utilized. According to this fact the adhesive material with low viscosity can be used as the adhesive material.

A 10th feature of the present invention is the semiconductor device according to the above described 9th feature and characterized by that the adhesive material holding means is made of a sponge like material. In this structure the adhesive material in the supporting body can be operated with a negative pressure and by this negative pressure the adhesive material can be supported in the body.

A 11th feature of the present invention is the semiconductor device according to the above described 9th feature and characterized by that the adhesive material holding means is made of an aggregated body of fibers. In this structure the adhesive material holding means is made of the aggregated body of fibers to hold the adhesive material.

A 12th feature of the present invention is the semiconductor device according to any one of the above described 9th to 11th feature and characterized by that the adhesive material holding means has a light transparent property. In this structure because the light can be irradiated onto all the holding adhesive material through the adhesive material holding means a photo curing type adhesive material can be usable.

A 13th feature of the present invention is the semiconductor device according to any one of the above described 2nd, 4th to 12th feature and characterized by that the substrate is made of a light transparent material, the semiconductor chip has an optical functional surface and a space is formed between the optical functional surface and the light transparent substrate as a light incident space. In this structure in addition to the action by the above described 2nd, 4th to 12th feature because the adhesive material is not disposed in the light path area, the light incident to (or going out from) the semiconductor chip is not blocked by the bubble or impurities in the adhesive material, thereby the problem that the performance of semiconductor chip is deteriorated would not occur.

A 14th feature of the present invention is the semiconductor device according to any one of the above described 3rd to 13th feature and characterized by that the adhesive material is a photo curing type adhesive material. In this structure the semiconductor chip and the substrate can be adhered to fix without any discrepancy of holding position due to thermal expansion because a rise in temperature would not almost occur when the adhesive material is cured by a light. Also it does never happen that a residual stress influenced by a temperature change in the adhering process.

A 15th feature of the present invention is the semiconductor device according to the above described 3rd to 13th feature and characterized by that the adhesive material is a heat curing type adhesive material having a curing temperature which is lower than a temperature that breaks a junction of the assembly. In this structure even in the area to which curing light cannot be reached, adhesive material can be cured by the heat curing type adhesive material.

And because the curing temperature for the heat curing type adhesive material is selected at a predetermined temperature that is lower than a temperature that breaks the conjunction of the assembly which electrically connects the semiconductor chip 2 with the wiring portion 5 of the substrate 1, the substrate 1 and the semiconductor chip 2 can be connected and fixed with maintaining a reliability of the electrical conjunction without occurrence of breakage of the conjunction.

A 16th feature of the present invention is the semiconductor device according to the above described 2nd feature and further including a fixing means which fixes the assembly on the substrate, characterized by that the fixing means has a heat radiating means. In this structure in addition to the action by the above described 2nd feature the generated heat in the semiconductor chip can be effectively released to environment. Also there is no need to add further parts for heat releasing.

A 17th feature of the present invention is a semiconductor device including an assembly in which a semiconductor chip having a functional surface at a front surface and a power supplying means are electrically connected at the functional surface, characterized by that the assembly is disposed on a substrate with the power supplying means side being the substrate side, the power supplying means has a slidably pinched portion between the semiconductor device and the substrate, the substrate and the semiconductor device are fixed together at a portion other than the pinched portion and a heat radiating means is disposed at a back side of the semiconductor chip.

In this structure a pinched portion of the power supplying means is free from the movement of substrate because at least pinched portion of the power supplying means moves integratedly with the semiconductor chip and the pinched portion is not fixed on the substrate when the substrate and the semiconductor chip make an expansion and contraction in different amount under an influence of heat. Accordingly any stress does not affect on the contacting portion between the power supplying means and the semiconductor chip thereby a breakage of the assembled portion can be prevented and furthermore because the heat radiating means is disposed heat generated from the semiconductor chip can be released effectively to environment and thereby deformation of the semiconductor chip can be prevented.

A 18th feature of the present invention is the semiconductor device according to the above described 17th feature and characterized by that an adhesive material which fixes the semiconductor chip and the substrate is filled at a space between the substrate and the functional surface of the semiconductor chip. In this structure in addition to the action by the above described 17th feature because the stress caused by the thermal expansion and contraction between the semiconductor chip and the substrate is not concentrated to specific region and the stress is absorbed in entire structure, thereby the local breakage of semiconductor chip and substrate can be prevented.

A 19th feature of the present invention is the semiconductor device according to the above described 17th feature and characterized by that the adhesive material which adheres the semiconductor chip and the substrate to fix, adheres them with contacting the substrate and a back surface of the semiconductor chip. In this structure in addition to the action by the above described 17th feature.

In this structure in addition to the action by the above described 17th feature because the stress caused by the thermal expansion and contraction between the semiconductor chip and the substrate is not concentrated to specific region and the stress is absorbed in entire structure, thereby the local breakage of semiconductor chip and substrate can be prevented.

And at the same time the adhesive material does not contact with a functional surface of the semiconductor chip and the above described problems are solved that the adhesive material becomes an invisible electrical circuit and it can not perform its desired function because it works as a capacitor with a harmful parasitic capacitance and that adhesive material block off the light path because it wraparound the light accepting surface (or the light emitting surface).

A 20th feature of the present invention is the semiconductor device according to the above described 17th feature and characterized by that the adhesive material which adheres the semiconductor chip and the substrate to fix, adheres them on at least one surface other than both of a front surface and the back surface of the semiconductor chip.

In this structure in addition to the action by the above described 17th feature because the stress caused by the thermal expansion and contraction between the semiconductor chip and the substrate is not concentrated to specific region and the stress is absorbed in entire structure, thereby the local breakage of semiconductor chip and substrate can be prevented.

Also the adhesive material 3 is made not to contact with the functional surface 2a (optical functional surface 20a) of the semiconductor, thereby the problem that the adhesive material becomes an invisible electrical circuit and the semiconductor device can not perform its desired function because it works as a capacitor with a harmful parasitic capacitance, or the problem that the adhesive materials happens to inundate to the accepting surface (or the light emitting surface) of the device and block off the light path when the semiconductor chip is utilized as the optical device, are solved.

A 21st feature of the present invention is the semiconductor device according to the above described 20th feature and characterized by that the adhesive material is covered with adhesive material which has been cured. In this structure in addition to the above described feature a flowing out of the adhesive material is cleared and thereby it is prevented that the flown out adhesive material enters into a space between the functional surface of the semiconductor chip and the substrate. Also the initial shape of the adhesive material is kept and thereby disposition of the adhesive material becomes easier.

A 22nd feature of the present invention is the semiconductor device according to the above described 21st feature and characterized by that a cross section of the adhesive material is a circular. In this structure in addition to the action by above described 21st feature strength can be given to the adhesive material against to the internal and external pressure before the adhesive material is cured.

A 23rd feature of the present invention is the semiconductor device according to the above described 21st feature and characterized by that a cross section of the adhesive material is a polygonal. In this structure in addition to the action by above described 21st feature the adhesive strength can be made higher because an adhering area between the adhesive material and the semiconductor chip and the substrate can be took wider.

A 24th feature of the present invention is the semiconductor device according to the above described 20th feature and characterized by that the adhesive material is held by an adhesive material holding means. In this structure in addition to the action by above described 20th feature the adhesive material would not wraparound between the functional surface of semiconductor and the substrate because the flowing out of adhesive material can be prevented effectively even when the adhesive material with low viscosity is utilized. According to this fact the adhesive material with low viscosity can be used as the adhesive material.

A 25th feature of the present invention is the semiconductor device according to the above described 24th feature and characterized by that the adhesive material holding means is made of a sponge like material. In this structure the adhesive material in the supporting body can be operated with a negative pressure and by this negative pressure the adhesive material can be supported in the body.

A 26th feature of the present invention is the semiconductor device according to the above described 24th feature and characterized by that the adhesive material holding means is made of an aggregated body of fibers. In this structure the adhesive material holding means is made of the aggregated body of fibers to bold the adhesive material.

A 27th feature of the present invention is the semiconductor device according to any one of the above described 24th to 26th feature and characterized by that the adhesive material holding means has a light transparent property. In this structure because the light can be irradiated onto all the holding adhesive material through the adhesive material holding means a photo curing type adhesive material can be usable.

A 28th feature of the present invention is the semiconductor device according to any one of the above described 24th to 26th feature and characterized by that the substrate is made of a light transparent material, the semiconductor chip has an optical functional surface and a space is formed between the optical functional surface and the light transparent substrate as a light incident space. In this structure in addition to the above action by above described 17th, 19th–27th feature because the adhesive material is not disposed in the light path area, the light incident to (or going out from) the semiconductor chip is blocked by the bubble or impurities in the adhesive material, thereby the problem that the performance of semiconductor chip is deteriorated would not occur.

A 29th feature of the present invention is the semiconductor device according to any one of the above described 17th to 28th feature and characterized by that the adhesive material is a photo curing type adhesive material. In this structure the semiconductor chip and the substrate can be adhered to fix without any discrepancy of holding position due to thermal expansion because a rise in temperature would not almost occur when the adhesive material is cured by a light. Also it does never happen that a residual stress influenced by a temperature change in the adhering process.

A 30th feature of the present invention is the semiconductor device according to any one of the above described 17th to 28th feature and characterized by that the adhesive material is a heat curing type adhesive material having a curing temperature which is lower than a temperature that breaks a junction of the assembly. In this structure even in the area to which curing light cannot be irradiated, adhesive material can be cured by the heat curing type adhesive material.

A 31st feature of the present invention is the semiconductor device according to the above described 17th feature and further including a fixing means which fixes the assembly on the substrate, characterized by that the fixing means has a heat radiating means. In this structure in addition to the action by above described 17th feature, the generated heat in the semiconductor chip can be effectively released to environment. Also there is no need to add further parts for heat releasing.

A 32nd feature of the present invention is the semiconductor device according to any one of the above described 17th to 30th feature and characterized by that the heat radiating means is made of an elastic member which performs an elastic deformation according to a thermal deformation of the semiconductor chip along a direction of the functional surface of the semiconductor chip. In this structure in addition to the above described 17th–30th feature, the heat radiating means would not regulate against the expansion and the contraction by heat and thereby the expansion and the contraction of the heat radiating means does not effect on the semiconductor chip. By this arrangement the semiconductor chip and the substrate are made to be free from the thermal stress other than caused by themselves, and thereby they are free from deformation by an external force.

A 33rd feature of the present invention is the semiconductor device according to the above described 32nd feature and characterized by that the elastic member is a wave like member which is formed in a wave like shape. In this structure in addition to the above described 32nd feature the heat radiating means can have the elasticity along an expansion and a contraction direction of the semiconductor chip even when the heat radiating means are made of a hard material.

A 34th feature of the present invention is the semiconductor device according to the above described 32nd feature and characterized by that the elastic member is a spiral like member which is formed in a spiral shape. In this structure in addition to the action by above described 32nd feature the heat radiating means can have the elasticity along an expansion and a contraction direction of the semiconductor chip even when the heat radiating means are made of a hard material.

A 35th feature of the present invention is the semiconductor device according to any one of the above described 17th to 31st feature and characterized by that the heat radiating means is a wire like member which is formed in a wire like shape. In this structure in addition to the action by above described 17th–31st feature to the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device.

A 36th feature of the present invention is the semiconductor device according to any one of the above described 17th to 31st feature and characterized by that the heat radiating means is a spike like member which is formed in a spike like shape. In this structure in addition to the Acton by above described 17th–31st feature to the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device.

A 37th feature of the present invention is the semiconductor device according to any one of the above described 17th to 31st feature and characterized by that the heat radiating means is a spherical member which is formed in a spherical shape. In this structure in addition to the action by above described 17th–31st feature to the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device.

A 38th feature of the present invention is the semiconductor device according to any one of the above described 17th to 31st feature and characterized by that the heat radiating means is made of a material which has a thermal expansion coefficient similar to that of the semiconductor device. In this structure in addition to the action by above described 17th–31st feature because the heat radiating means which has the thermal expansion coefficient near to that of the semiconductor device, the heat radiating means expands and contracts equally corresponding to the expansion and contract of the semiconductor device along the longer direction which is caused by a heat generation. By this arrangement the heat radiating means would not influence to the expansion and the contraction of the semiconductor device. And at the same time the expansion and the contraction of the heat radiating means would not influence on the semiconductor chip. Because of this fact the heat radiating means would not give a stress to the semiconductor device and it can increase the heat releasing effect.

A 39th feature of the present invention is the semiconductor device according to any one of the above described 17th to 28th feature and characterized by that the semiconductor chip is a solid state image forming device. In this structure in addition to the action by above described 13th–28th feature because the adhesive material is not disposed in the light path area, the light incident to (or going out from) the semiconductor chip is blocked by the bubble or impurities in the adhesive material, thereby the problem that the performance of semiconductor chip is deteriorated would not occur.

A 40th feature of the present invention is an image scanning unit characterized by including the semiconductor device. In this structure because the contacted portion between the solid state image forming device and the power supplying means is made free from breakage by heat and the incident light to the solid state image forming device is not blocked off and the performance of solid state image forming device can be carried out sufficiently, there is no possibility of occurrence of error in reading the image data and thereby the image scanning unit with high reliability can be provided.

A 41st feature of the present invention is an image forming apparatus characterized by including the image scanning unit. In this structure because the contacted portion between the solid state image forming device and the power supplying means is made free from breakage by heat and the performance of solid state image forming device can be carried out sufficiently, there is no possibility of occurrence of error in reading the image data and because the image forming apparatus includes the image forming unit which can carry out the image forming with high reliability, the apparatus can form electrostatic latent image with high accuracy thereby there is no possibility of occurrence of error in reading the image of the manuscript.

DETAILED DESCRIPTION OF THE PREFERRED EMBODIMENTS

Figure 1:
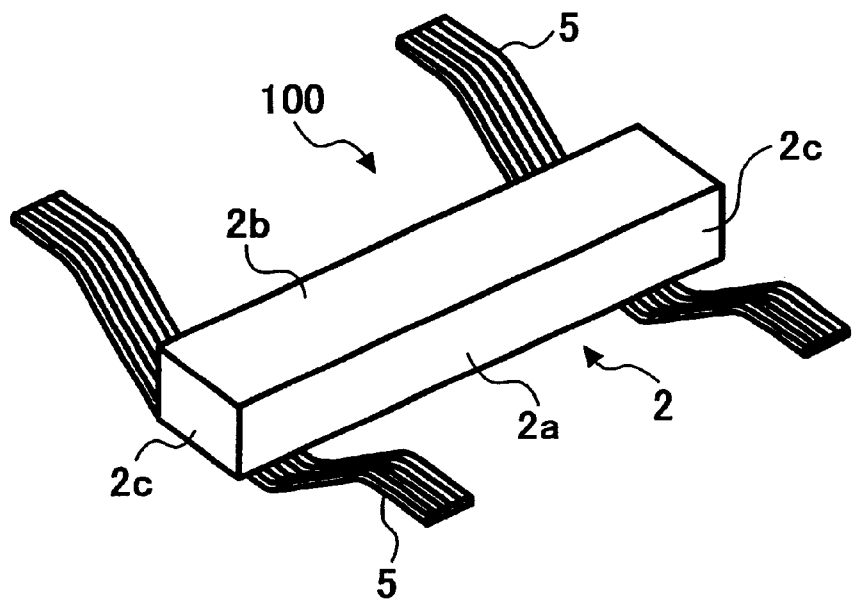
FIG. 1 is a perspective view to show an entire structure of an assembly included in the semiconductor chip according to the present invention.

Hereinafter detailed description of the preferred embodiment of present invention will be given with reference to the accompanied drawings. In the embodiments hereafter will be described, to portions which are the same or equivalent is given a same reference numeral and further explanation thereof will be omitted.

As shown in FIG. 1 an assembly 100 includes a semiconductor chip 2 which is a bare chip and a power supplying means 5 which is bonded with a flip chip bonding method to the semiconductor chip 2. The semiconductor chip 2 is composed of a functional surface 2a of semiconductor which is a circuit surface formed in a front side, side surfaces 2c which define a circumferences of the functional surface 2a and a back surface 2b which is formed at an opposing surface of the functional surface 2a. The power supplying means 5 is made of, for example, a flexible circuit board.

Figure 2:
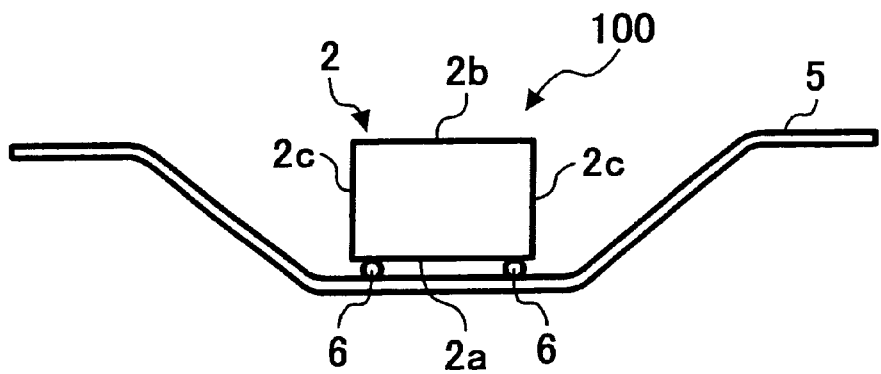
FIG. 2 is a cross sectional view along a direction perpendicular to a longer direction of the assembly shown in FIG. 1.

As shown in FIG. 2 electrode 6 which are bumps (protruding connecting electrode) made of material such as solder or gold and so on and by which the power supplying means 6 and the circuit on the functional surface 2a of semiconductor chip 2 are electrically connected. At this point because the power supplying means 5 and the functional surface 2a of semiconductor chip 2 are bonded by means of a face down bonding, for example, such as flip chip bonding, TAB (WDSH DXWRPDWHG ERQGLQJ), beam lead bonding and so on, the power supplying means 5 and the functional surface 2a of semiconductor chip 2 may be bonded with an adhesive material or even may not be bonded. By the way in FIG. 2 an example by flip chip bonding is shown.

Figure 3:
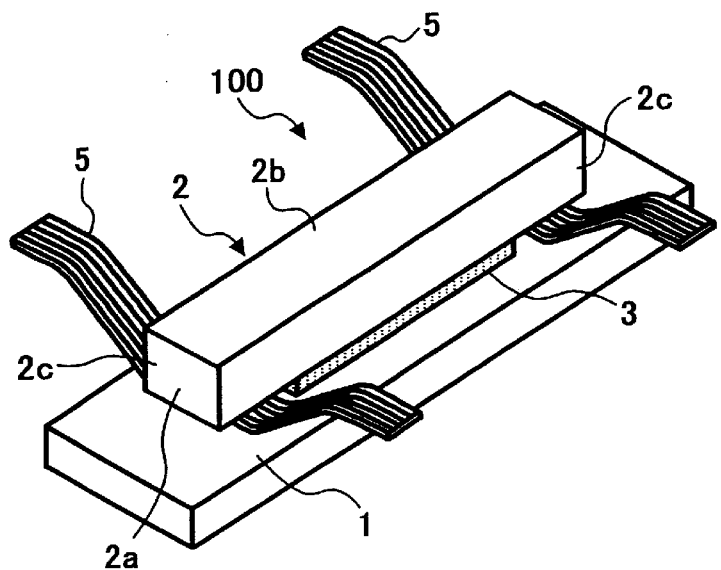
FIG. 3 is a perspective view to show an entire structure of the semiconductor device according to a first embodiment of the present invention.

As shown in FIG. 3 the semiconductor chip is composed of the above described assembly 100, a substrate 1 and an adhesive material 3 which is disposed between a couple of power supplying means 5 of the assembly 100 and between the substrate 1 and the semiconductor chip 2. The semiconductor chip shown in FIG. 3 is in a state that the assembly 100 on which the power supplying means 5 is bonded on the semiconductor chip 2 by the flip chip bonding, is adhered on the substrate 1 through the adhesive material 3.

Figure 4:
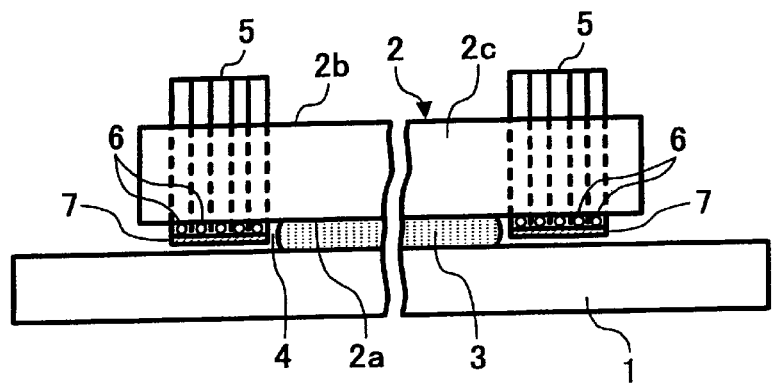
FIG. 4 is a cross sectional view along a longer direction of the semiconductor device shown in FIG. 3.
Figure 5:
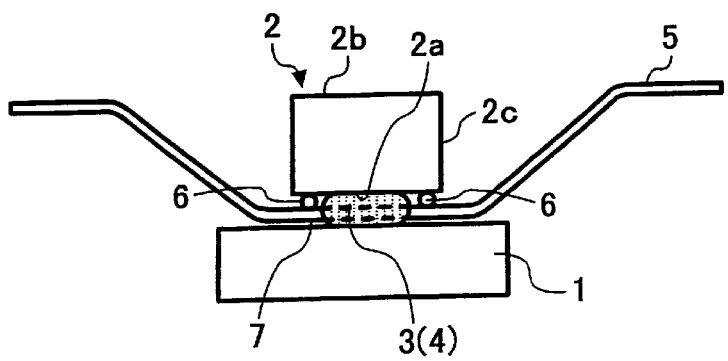
FIG. 5 is a cross sectional view along a direction perpendicular to the longer direction of the semiconductor device shown in FIG. 3.

As shown in FIG. 4 and FIG. 5, a space 4 which corresponds to the summed thickness of power supplying means 5 and the electrode 6 is formed between the substrate 1 and the semiconductor chip 2.

In the power supplying means 5 there is a portion 7 which is pinched between the substrate 1 and the semiconductor chip 2 and the pinched portion 7 is not fixed to the substrate 1. However, when in a case the power supplying means 5 is made of a material with flexibility such as flexible circuit board, in a portion of the power supplying means 5 which is not pinched between the substrate 1 and the semiconductor chip 2, that is to say a portion other than the pinched portion 7 the substrate 1 and the power supplying means 6 may be fixed though it is not shown in the drawings. The reason of this is that because the power supplying means 5 has flexibility and the amount of thermal expansion of the substrate 1 is absorbed by the thermal expansion and thereby stress does not concentrate at the electrode 6.

Figure 6:
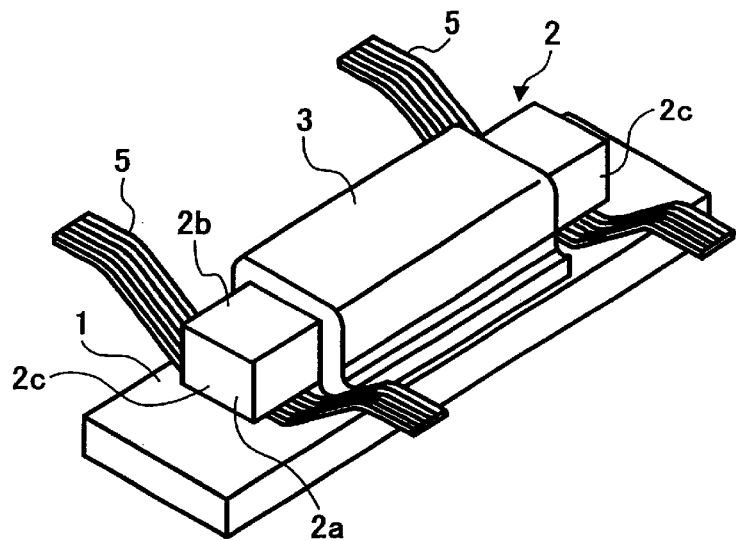
FIG. 6 is a perspective view to show an entire structure of the semiconductor device according to a second embodiment of the present invention.
Figure 7:
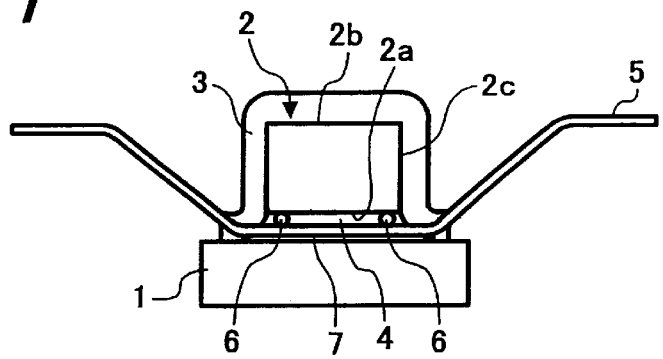
FIG. 7 is a cross sectional view along a direction perpendicular to the longer direction of the semiconductor device shown in FIG. 6.

As shown in FIG. 6 and FIG. 7 in the semiconductor device in accordance with a second embodiment there is a difference from the first embodiment that a belt like adhesive material 3 covers and fixed on the back surface 2b and side surface 2c of the semiconductor chip 2 and the surface of substrate 1 in place that the substrate 1 and the functional surface 2a of semiconductor chip 2 are adhered on their surfaces by the adhesive material. At this point the space 4 is formed between the substrate 1 and the semiconductor chip 2 and the space 4 forms a space which does not contain the adhesive material 3.

A width of the belt like adhesive material 3 along the longer direction of the semiconductor chip is made narrower than a space between the couple of power supplying means 5. One example of this width is shown in FIG. 6 it may be narrower or wider than the example shown as adhesive material 3 in the drawing as far as it is narrower than a distance between the couple of power supplying means 5 at their inner most distance.

In place that the belt like adhesive material 3 is disposed between the couple of power supplying means 5, it may be disposed at least one outside of the couple of power supplying means 6 in order not to over wrap with the power supplying means 6.

Also the belt like adhesive material 3 may be disposed in combination of a case between the couple of power supplying means and a case at least one outside of the couple of power supplying means 5. That is to say it is enough that the power supplying means 5 and the adhesive material 3 are separated along the longer direction of the semiconductor chip 2 in order not to interfere together. By this arrangement the substrate 1 and the pinched portion 7 of power supplying means 6 are not adhered together.

In accordance with the embodiment shown in FIG. 6 and FIG. 7 because the adhesive material 3 covers both surfaces of the substrate 1 and the back surface 2b of semiconductor functional surface and a concentration of the expansion and contraction stress at a specific portion is cleared, the stress is distributed to whole portion and thereby local breakage of the semiconductor chip 2 and the substrate 1 can be prevented.

Also the adhesive material 3 is made not to contact with the functional surface 2a (optical functional surface 20a) of the semiconductor, thereby the problem that the adhesive material becomes an invisible electrical circuit and the semiconductor device can not perform its desired function because it works as a capacitor with a harmful parasitic capacitance, or the problem that the adhesive materials happens to inundate to the accepting surface (or the light emitting surface) of the device and block off the light path when the semiconductor chip is utilized as the optical device, are solved.

Figure 8:
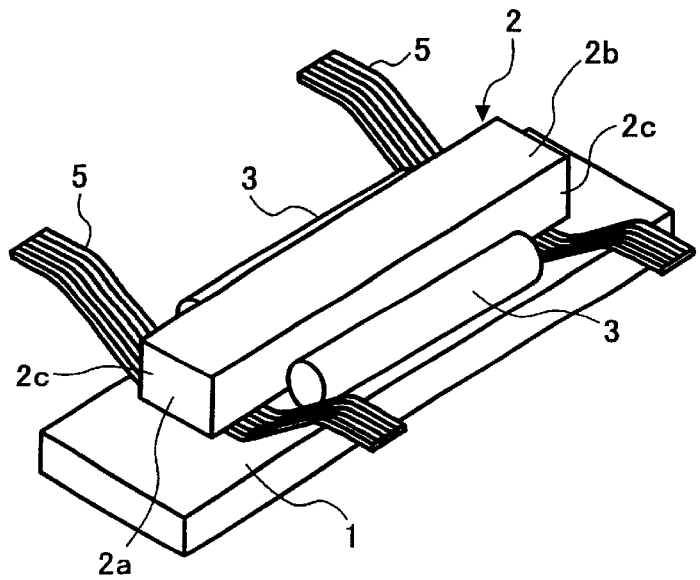
FIG. 8 is a perspective view to show an entire structure of the semiconductor device according to-a third embodiment of the present invention.
Figure 9:
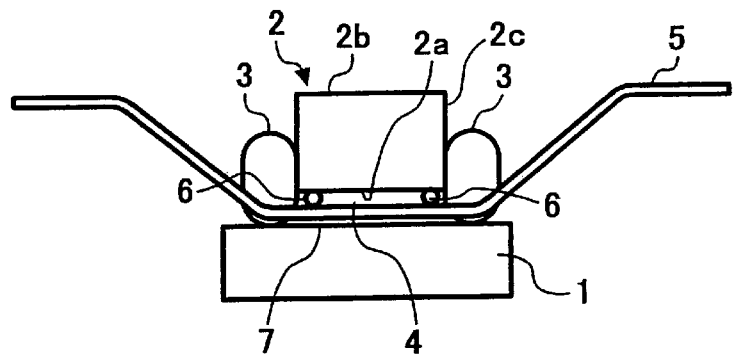
FIG. 9 is a cross sectional view along a direction perpendicular to the longer direction of the semiconductor device shown in FIG. 8.

FIG. 8 is a perspective view to show an entire structure of the semiconductor device according to a third embodiment of the present invention and FIG. 9 is a cross sectional view along a direction perpendicular to the longer direction of the semiconductor device shown in FIG. 8. As shown in FIG. 8 and FIG. 9 in the semiconductor device in accordance with a third embodiment there is a difference from the second embodiment that the semiconductor chip 2 and a substrate 1 are adhered together with a cylindrical adhesive material 3 at surfaces other than a functional surface 2a of the semiconductor chip and an opposite surface 2b of the functional surface 2a, that is to say at the side surfaces 2c in place that a belt like adhesive material 3 covers and fixed on the back surface 2b and side surface 2c of the semiconductor chip 2 and the surface of substrate 1. At this point the space 4 is formed between the substrate 1 and the semiconductor chip 2 and the space 4 forms a space which does not contain the adhesive material 3.

The above described cylindrical adhesive material 3 is cured only at its surface portion and covered with the cured portion and the covered surface is broken only at portions which contact with the surfaces to be adhered, and an uncured adhesive material inside is exposed to be adhered with the surface to be adhered, thereby a surface of the substrate 1 and the side surfaces 2c of semiconductor chip 2 are adhered together.

A curing of the surface portion of adhesive material 3 is performed, for example, by a heating at surface portion to cure only at the surface portion when a heat curing type adhesive material is used, or by a ultra violet irradiation in short time to cure only at the surface portion when an ultra violet curing type adhesive material is used.

And after the adhesive material is disposed in a predetermined adhering position, the entire surfaces to be adhered are broken to be adhered by giving pressure, heating up, a laser irradiation and so on.

A length of the above described cylindrical adhesive material 3 along a longer direction is adjusted in the length which is almost equal to that of the semiconductor chip 2 in this embodiment as shown in FIG. 8. One example of this width is shown in FIG. 8 it may be narrower or wider than the example shown as adhesive material 3 in the drawing as far as it is narrower than a distance between the couple of power supplying means 6 at their inner most distance. In place that the cylindrical adhesive material 3 is disposed between the couple of power supplying means 5, it may be disposed at least one outside of the couple of power supplying means 6 in order not to overlap with the power supplying means 5. Also the cylindrical adhesive material 3 may be disposed in combination of a case between the couple of power supplying means and a case at least one outside of the couple of power supplying means 5. That is to say it is enough that the power supplying means 5 and the adhesive material 3 are separated along the longer direction of the semiconductor chip 2 in order not to interfere together. By this arrangement the substrate 1 and the pinched portion 7 of power supplying means 5 are not adhered together.

The above described adhesive material 3 can have enough strength against internal and external pressure because it is a circular, that is to say, it has a circular cross section. Or in another case when the adhesive material 3 is made to have a shape with polygonal pillar, that is to say it has a polygonal cross section, it shows an advantage in the adhering process because area of the surface to be adhered can be expanded.

In the case when the adhesive material has a polygonal pillar shape, it is preferable that an angle which is made between the two surfaces to be the surfaces to be adhered, is made to be almost the same as the angle which is made between the surface of substrate 1 and the side surface 2c of the semiconductor chip 2. When the angle which is made between the two surfaces to be adhered, is almost the same as an angle which is made between the surface of substrate 1 and the side surface 2c of the semiconductor chip 2, it may have a shape that a part of the cylindrical pillar is cut away.

And also though there is no drawing to show, the same structure can be employable in a case when the adhesive material 3 is held by an adhesive material holding member as an adhesive material supporting body instead of curing its surface. Because the adhesive material 3 is held by the adhesive material holding member, the adhesive material 3 is prevented to flow out and thereby the adhesive material 3 would not enter into a space between the substrate 1 and the functional surface 2a of the semiconductor chip.

For the adhesive material holding member, for example, a material like a sponge can be employable.

In such case because the adhesive material 3 is the material like a sponge, the adhesive material in the supporting body can be operated with a negative pressure to support the adhesive material in the body.

And also aggregated body of fiber and so on can be employable as the adhesive material holding member.

That is to say, it is sufficient for the adhesive material holding member to have a holding force to keep the adhesive material 3 not to flow out.

And also when the adhesive material holding member is made to have a light transparent property, the adhesive material of a photo curing type can be employable because a light can be irradiated to the adhesive material 3 through the adhesive material holding member.

Figure 10:
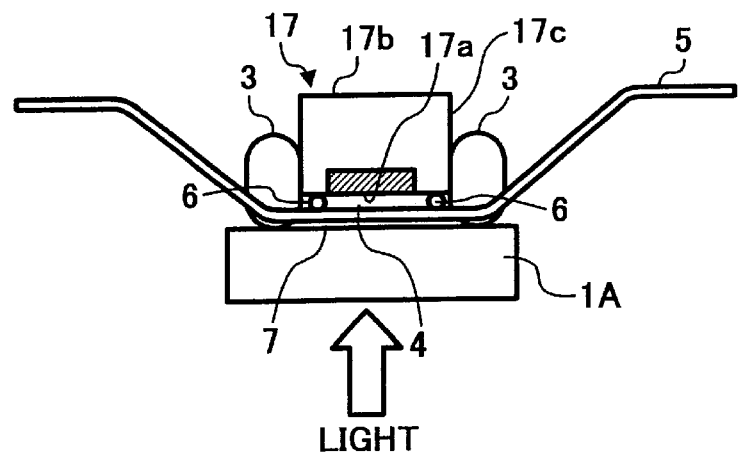
FIG. 10 is a cross sectional view which is corresponding to the cross sectional view of FIG. 9 when the semiconductor device shown in FIG. 8 and FIG. 9 are utilized in a solid state image forming apparatus as an optical functional component.

FIG. 10 is a cross sectional view which is corresponding to the cross sectional view of FIG. 9 when the semiconductor device shown in FIG. 8 and FIG. 9 are utilized in a solid state image forming apparatus as an optical functional component.

As shown in FIG. 10 the solid state image forming apparatus as a semiconductor device is composed by that a light transparent substrate 1A such as glass, plastic and so on is used as the substrate 1, and a solid state image forming device 17 is used as the semiconductor chip 2 in the semiconductor device of the third embodiment shown in FIG. 8 and FIG. 9, and other structure is quite the same as the semiconductor device shown in FIG. 8 and FIG. 9.

In the solid state image forming device 17 an optical functional surface 17a is included which is corresponding to the functional surface 2a of the semiconductor chip 2.

In the solid state image forming device surfaces other than both of the optical functional surface 17a as a front surface and back surface 17c which is opposite to the front surface, that is to say the side surface 17c and the substrate 1A are adhered by the adhesive material 3. At this point the optical functional surface 17a is not covered by the adhesive material 3.

In accordance with any one of the embodiment shown in FIG. 8 to FIG. 10 because the adhesive material 3 adheres the substrate 1 at least one surface other than the functional surface 2a (optical functional surface 17a) of the semiconductor chip and the back surface 2b which is opposite to the functional surface, that is to say at the side surfaces 2c, and a concentration of the expansion and contraction stress at a specific portion is cleared, the stress is distributed to whole portion and thereby local breakage of the semiconductor chip 2 and the substrate 1 can be prevented.

At the same time the adhesive material 3 is made not to contact with the functional surface 2a (optical functional surface 17a) of the semiconductor, thereby the problem that the adhesive material becomes an invisible electrical circuit and the semiconductor device can not perform its desired function because it works as a capacitor with a harmful parasitic capacitance, or the problem that the adhesive materials happens to inundate to the accepting surface (or the light emitting surface) of the device and block off the light path when the semiconductor chip is utilized as the optical device, are solved.

In accordance with any one of the embodiment shown in FIG. 8 to FIG. 10, the adhesive material 3 is made not to flow out and to enter the space between the substrate 1 (1A) and the functional surface 2a (optical functional surface 17a) of semiconductor because the adhesive material 3 is covered with the cured adhesive material 3 in the surface portion.

Further in accordance with any one of the embodiments shown in FIG. 8 to FIG. 10, the adhesive material 3 is made to have enough strength against internal and external pressure even before it is cured because it has a circular cross section. And at the same time the manufacturing of it is achieved easily.

Also in accordance with the embodiment shown in FIG. 10, the problem that the adhesive material 3 blocks off the incident light coming from (or the outgoing light to) the light path, and thereby the optical performance of the device can not be carried out because the optical functional surface 17a is not covered by the adhesive material when the substrate 1 is made by a material with the light transparent property and the semiconductor device 2 is the optical functional device.

Figure 11:
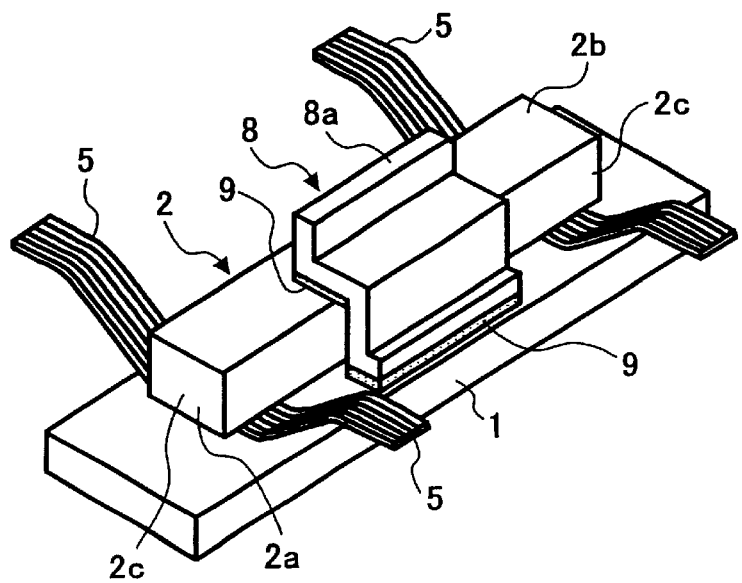
FIG. 11 is a perspective view to show an entire structure of the semiconductor device according to a forth embodiment of the present invention.

FIG. 11 is a perspective view to show an entire structure of the semiconductor device according to a forth embodiment of the present invention.

As shown in FIG. 11 a fixing means 8 which is arranged to fix the assembly 100 onto the substrate 1 through an adhesive material 9 is adhered. The adhesive material 9 which is shown if FIG. 11 and the above described adhesive material 3 which adheres the semiconductor chip 2 and the substrate 1 are different and the adhesive material 3 is not used here then the assembly 100 is fixed on the substrate 1 only by the fixing means 8 which is arranged to fix.

The above described fixing means 8 is made of a material with good coefficient of thermal conductivity and the fixing means 8 has itself also a heat releasing effect, as for one example, a bent portion 8a is arranged which has a function of expanding surface area as a heat radiating means, thereby the heat releasing effect is increased much higher level.

In accordance with the embodiment shown in FIG. 11 because the fixing means 8 to fix the substrate 1 and the assembly 100 on which the semiconductor chip 2 is electrically connected to the power supplying means 6, is included and the heat radiating means is also mounted on the fixing means 8 also, the heat generated by the semiconductor chip 2 can be effectively released. At the same time no further parts for heat releasing is not required.

In accordance with the embodiment shown in FIG. 6 to FIG. 11 because no adhesive material 3 is contained between the substrate 1 (1A) and the semiconductor chip 2 (solid state image forming device 17) and the semiconductor chip 2 is adhered between the couple of power supplying means 5, and a length for adhesion can be shortened and thereby a curvature which is caused by difference of the thermal expansion coefficient can be prevented. Moreover because the concentration of stress and the curvature can be prevented, a necessity to consider the thermal expansion coefficient is cleared when a material used for the substrate 1 (1A) is selected, thereby a degree of freedom for selecting the substrate material can be largely expanded. And when in case the solid state image forming device 17 is utilized as the semiconductor chip 2, the occurrence of out of focus is prevented by means of preclusion of curvature, and at the same time there is produced further effect that coefficient of transmission for incident light becomes higher.

Figure 12:
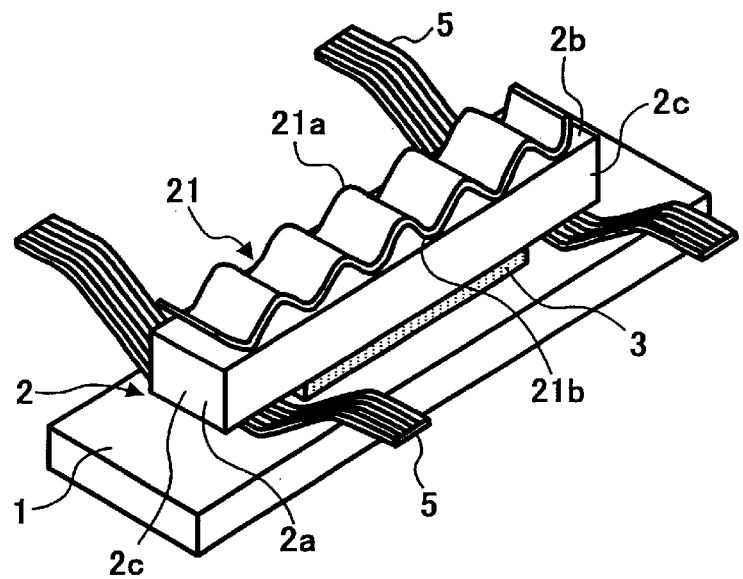
FIG. 12 is a perspective view to show an entire structure of the semiconductor device according to a fifth embodiment of the present invention.

FIG. 12 is a perspective view to show an entire structure of the semiconductor device according to a fifth embodiment of the present invention. As shown in FIG. 12 the semiconductor device of the embodiment 5 of the present invention has a difference that heat radiating means 21 is disposed from the semiconductor device of embodiment 1 shown in FIG. 3 to FIG. 5 and other structure is quite the same.

The heat radiating means 21 is made to be in a wave like shape in succession of a top 21a and a bottom 21b and it is adhered onto the back surface 2b of semiconductor chip 2 at the bottoms 21b by an adhesive material and so on. The heat radiating means 21 has an elastic property for an expansion and a contraction along the longer direction of the semiconductor dc 2 by heat because the wave like heat radiating means 21 is arranged along a longer direction of the semiconductor chip 2 as described above. By this arrangement when an expansion or a contraction of the semiconductor chip 2 is caused by heat, the heat radiating means 21 would not influence to the expansion and the contraction. And at the same time the expansion and the contraction of the heat radiating means 21 would not influence on the semiconductor chip 2. By this arrangement the semiconductor chip 2 and the substrate 1 are made to be free from the thermal stress other than caused by themselves, and thereby they are free from deformation by an external force.

Figure 13:
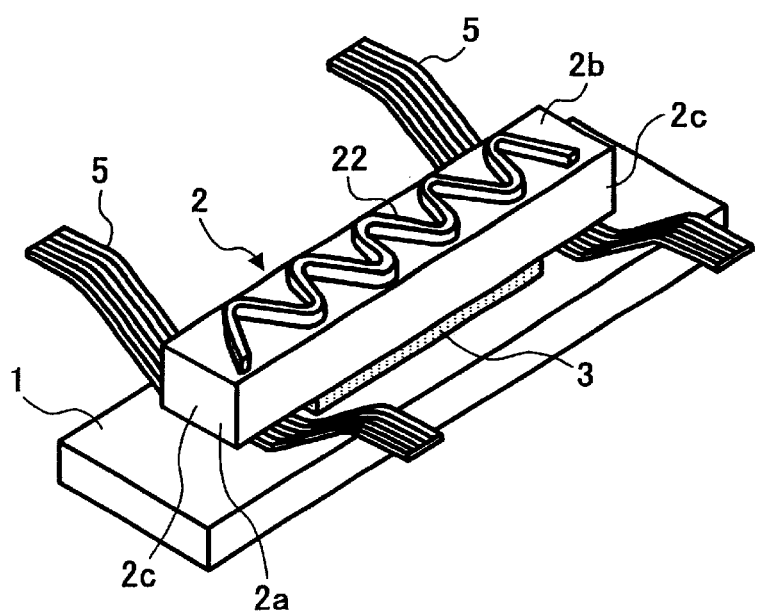
FIG. 13 is a perspective view to show a modified example of a heat radiating means for the semiconductor device illustrated in FIG. 12.

FIG. 13 is a perspective view to show a modified example of a heat radiating means for the semiconductor device illustrated in FIG. 12.

As shown in FIG. 13 the semiconductor device of this embodiment has different at the heat radiating means from the semiconductor device of embodiment 5 shown in FIG. 12 and other structure is quite the same as the semiconductor device of embodiment 1.

The heat radiating means 22 of this embodiment is arranged in different direction from the heat radiating means 21 in FIG. 12. As described above though the semiconductor chip 2 expands and contracts in its longer direction with influence of the heat, because the beat radiating means 22 is made to have an elasticity, it has the same action and effect as the heat radiating means 21 shown in FIG. 12.

Figure 14:
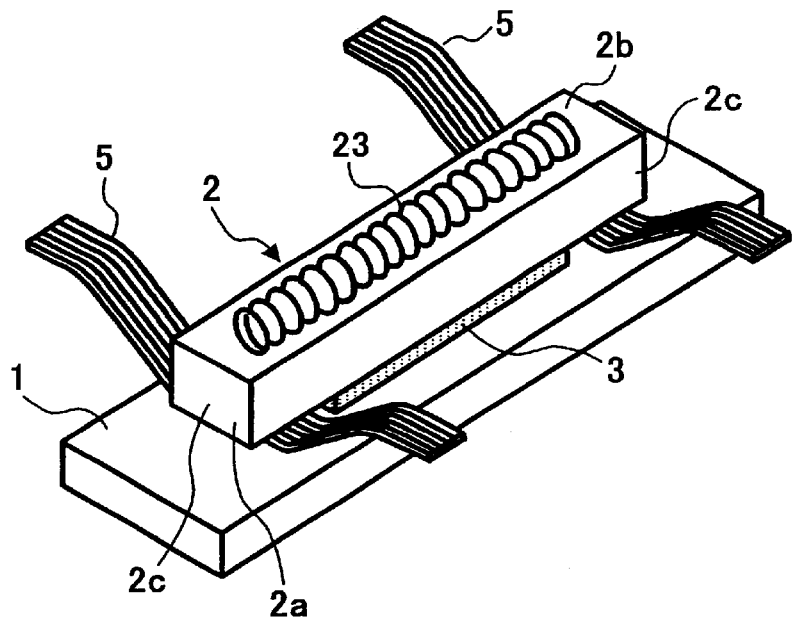
FIG. 14 is a perspective view to show another modified example of a heat radiating means for the semiconductor device illustrated in FIG. 12.

FIG. 14 is a perspective view to show another modified example of a heat radiating means for the semiconductor device illustrated in FIG. 12.

As shown in FIG. 14 this semiconductor device is made to be a same device other than shape of the heat radiating means from that of the embodiment 5 and other structure is quite the same as the device according to the embodiment 5 shown in FIG. 12.

The heat radiating means 23 is formed to be in a spiral shape and attached with a central axis of the spiral being aligned along the longer direction of the semiconductor chip.

As described above though the semiconductor chip 2 expands and contracts in its longer direction with influence of the heat, because the heat radiating means 23 is made to have an elasticity, it has the same action and effect as the heat radiating means 21 shown in FIG. 12.

In accordance with any one of the embodiment shown in FIG. 12 to FIG. 14, because the heat radiating means 21, 22 are made to be in the wave like form and the heat radiating means 23 is made to be in the spiral form, that have the elasticity for the deformation along the surface direction, the heat radiating means 21–23 would not be obstructive to the expansion and the contraction against the expansion or the contraction of the semiconductor chip 2 caused by the heat. And at the same time the expansion and the contraction of the heat radiating means 21–23 would not influence on the semiconductor chip 2. By this arrangement the semiconductor chip 2 and the substrate 1 are made to be free from the thermal stress other than caused by themselves, and thereby they are free from deformation by an external force.

In accordance with any one of the embodiment a shown in FIG. 12 to FIG. 14, the heat radiating means can have the elasticity along an expansion and a contraction direction of the semiconductor chip 2 even when the heat radiating means 21–23 are made of a hard material because the heat radiating means 21, 22 are made to be members of the wave like shape and the heat radiating means 23 is made to be member in the spiral shape.

Figure 15:
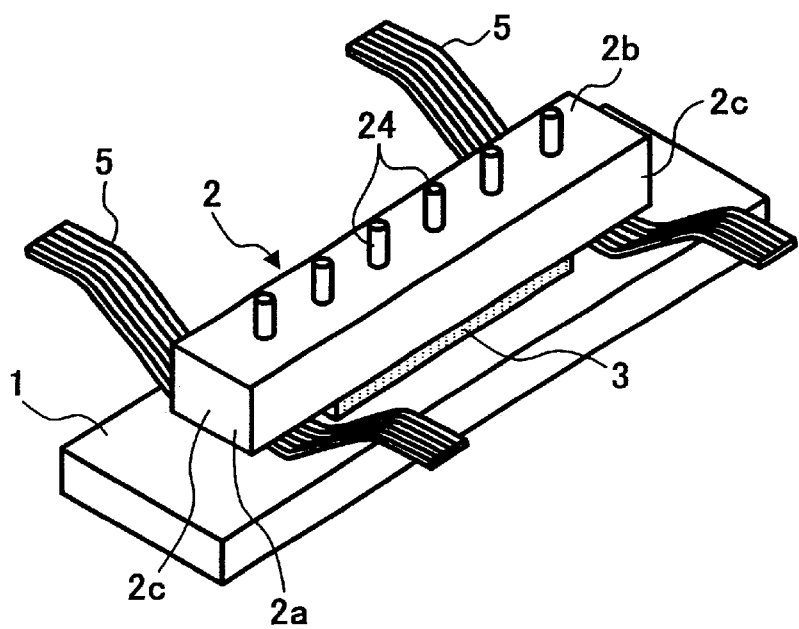
FIG. 15 is a perspective view to show the other modified example of a heat radiating means for the semiconductor device illustrated in FIG. 12.

FIG. 15 is a perspective view to show the other modified example of a heat radiating means for the semiconductor device illustrated in FIG. 12.

As shown in FIG. 15 this semiconductor device is made to be a same device other than shape of the heat radiating means from that of the embodiment 5 and other structure is quite the same as the device according to the embodiment 5 shown in FIG. 12.

The heat radiating means 24 of this embodiment is made to be in a line shape by a wire bonding apparatus which utilizes a thermal compression bonding method, an ultrasonic bonding in the prior art technology with cutting the wires in a halfway of the process. As described above though the semiconductor chip 2 largely expands and contracts in its longer direction with influence of the heat, because the heat radiating means 24 is made to have a smaller area space contacting with the semiconductor device 2 in the direction, when an expansion or a contraction of the semiconductor chip 2 is caused by heat, the beat radiating means 14 would not be obstructive to the expansion and the contraction. And at the same time the expansion and the contraction of the heat radiating means 24 would not influence on the semiconductor chip 2. By this arrangement the semiconductor chip 2 and the substrate 1 are made to be free from the thermal stress other than caused by themselves, and thereby they are free from deformation by an external force.

Figure 16:
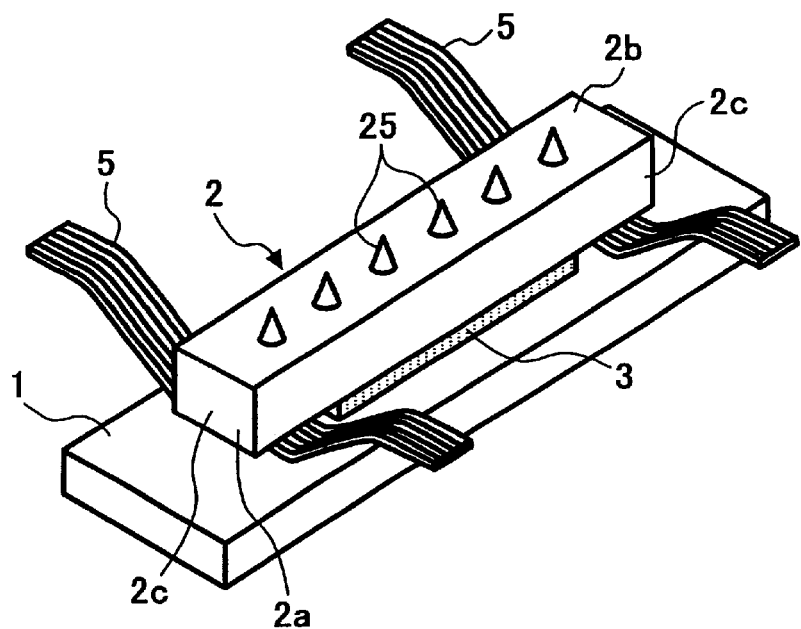
FIG. 16 is a perspective view to show still other modified example of a heat radiating means for the semiconductor device illustrated in FIG. 12.

FIG. 16 is a perspective view to show still other modified example of a heat radiating means for the semiconductor device illustrated in FIG. 12.

As shown in FIG. 9 this semiconductor device is made to be a same device other than shape of the heat radiating means from that of the embodiment 5 and other structure is quite the same as the device according to the embodiment 5 shown in FIG. 12.

The heat radiating means 25 of this embodiment is made to be in a spike shape by a wire bonding apparatus which utilizes a thermal compression bonding method, an ultrasonic bonding in the prior art technology with cutting the wires in a halfway of the process. As shown in FIG. 16 even the beat radiating means in shape of a spike which is made when a solder is wire bonded, has the heat radiation effect.

As described above though the semiconductor chip 2 largely expands and contracts in its longer direction with influence of the heat, because the heat radiating means 25 is made to have a smaller area space contacting with the semiconductor device 2 in the direction, it has the same action and effect as the heat radiating means shown in FIG. 16.

That is to say in accordance with the embodiment shown in FIG. 16 when an expansion or a contraction of the semiconductor chip 2 is caused by heat, the heat radiating means 25 would not be obstructive to the expansion and the contraction because the heat radiating means 25 is made to be a member in spike like shape and to have a smaller contacting area space contracting with the semiconductor device 2 in the direction. And at the same time he heat radiating means 25 would not give an influence the stress to the semiconductor chip 2 caused by a deformation of itself.

Figure 17:
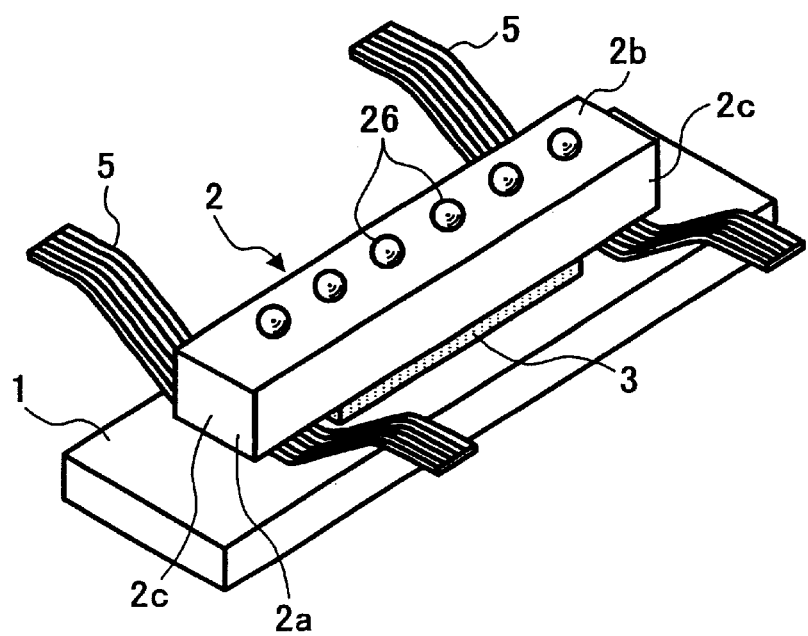
FIG. 17 is a perspective view to show still other modified example of a heat radiating means for the semiconductor device illustrated in FIG. 12.

FIG. 17 is a perspective view to show still other modified example of a heat radiating means for the semiconductor device illustrated in FIG. 12.

As shown in FIG. 17 this semiconductor device is made to be a same device other than shape of the heat radiating means from that of the embodiment 5 and other structure is quite the same as the device according to the embodiment 5 shown in FIG. 12.

The heat radiating means 26 is made to be in a spherical shape. As shown in FIG. 17 even the heat radiating means in a spherical shape which is made when a solder is melted to become spherical and put on the semiconductor chip 2 to adhere, has the heat radiation effect.

As described above though the semiconductor chip 2 largely expands and contracts in its longer direction with influence of the heat, because the heat radiating means 26 is made to have a smaller area space contacting with the semiconductor device 2 in the direction, it has the same action and effect as the heat radiating means shown in FIG. 15.

That is to say in accordance with the embodiment shown in FIG. 17 when an expansion or a contraction of the semiconductor chip 2 is caused by heat, the heat radiating means 26 would not be obstructive to the expansion and the contraction because the heat radiating means 26 is made to be a member in spherical shape and to have a smaller contacting area space contracting with the semiconductor device 2 in the direction. And at the same time the heat radiating means would not give an influence the stress to the semiconductor chip 2 caused by a deformation of itself.

Figure 18:
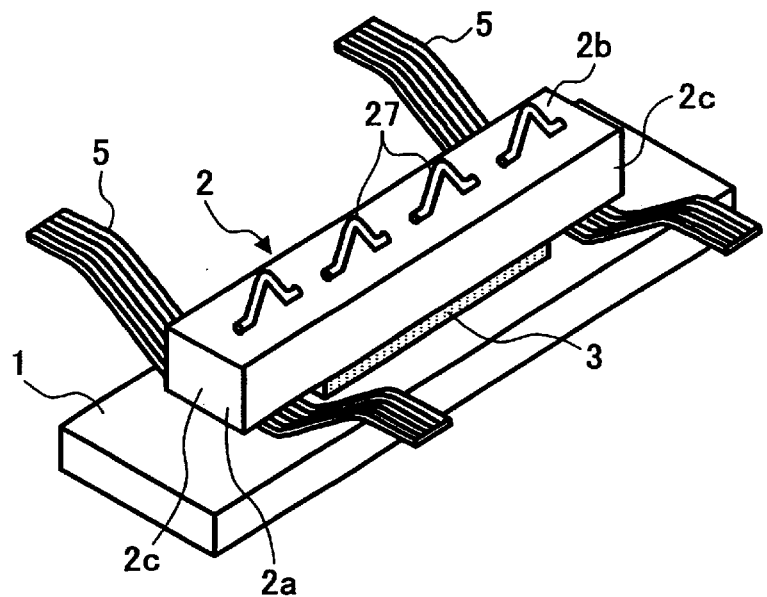
FIG. 18 is a perspective view to show still other modified example of a heat radiating means for the semiconductor device illustrated in FIG. 12.

FIG. 18 is a perspective view to show still other modified example of a heat radiating means for the semiconductor device illustrated in FIG. 12.

As shown in FIG. 18 this semiconductor device 27 is another example of the heat radiating means in a line shape shown in FIG. 15. When it is difficult to make the heat radiating means 14 stand straight by the wire bonding apparatus as shown in FIG. 18, it may be arranged that a plurality of wires are put on the semiconductor chip to be contact bonded at two points of the each wire as shown in FIG. 11. The heat radiating means 27 is formed in, for example, a line shape with inverted V. The heat radiating means 27 has also the same action and effect as the heat radiating means 24 shown in FIG. 15.

Figure 19:
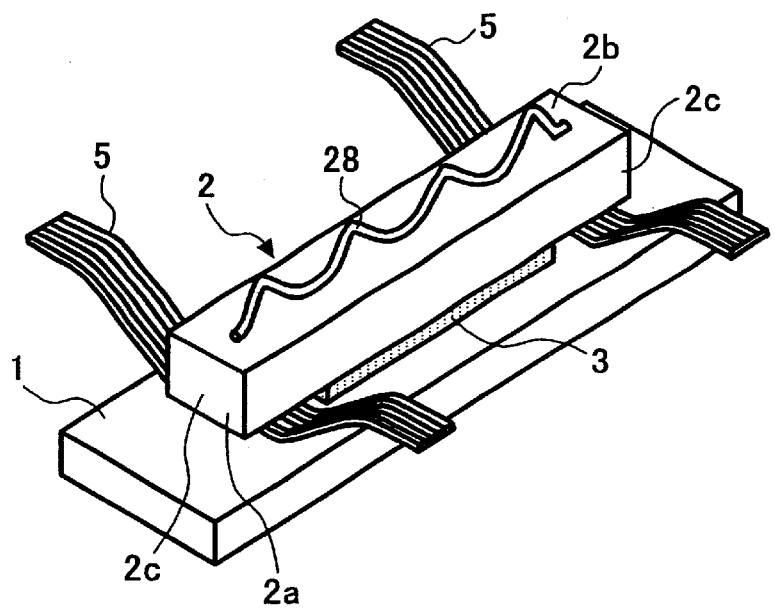
FIG. 19 is a perspective view to show still other modified example of a heat radiating means for the semiconductor device illustrated in FIG. 12.

FIG. 19 is a perspective view to show still other modified example of a heat radiating means for the semiconductor device illustrated in FIG. 12.

As shown in FIG. 19 this heat radiating means 28 of the semiconductor device is other example of the heat radiating means 24 in a line shape shown in FIG. 15. When it is difficult to make the heat radiating means 24 stand straight by the wire bonding apparatus as shown in FIG. 15, it may be arranged that a bent wire is put on the semiconductor chip to be contact bonded at a plurality of points of the wire as shown in FIG. 19. For the heat radiating means 28, for example, a plurality of inverted V shape lines are continuously formed with bending in this embodiment. The heat radiating means 28 also has the same action and effect as the heat radiating means 27 shown in FIG. 18.

The heat radiating means 21–28 shown in FIG. 12 to FIG. 19 are preferably made of a material with high thermal conductivity such as metal and it may be bonded by an adhesion or a contact bonding. Especially for the heat radiating means 24–28 as shown in FIG. 15 to FIG. 19, it may be bonded by means of the wire bonding apparatus in the prior art technology and in such cases the heat radiating means is preferably made in the shape shown in the FIG. 15 to FIG. 17.

When the heat radiating means 21–29 are attached to the semiconductor device shown in FIG. 6, it is performed with subject to the back surface 2b which is the opposing surface to the functional surface of semiconductor device 2 and where the adhesive material is not coated.

In accordance with any one of the embodiment shown in FIGS. 15, 18 and 19, because the heat radiating means 24, 27 and 28 are made to be the members in a form of line and the heat radiating means 24, 27 and 28 have small contacting area surface with the semiconductor chip, thereby the heat radiating means 14, 17 and 18 would not be obstructive to the expansion and the contraction against the expansion or the contraction of the semiconductor chip 2 caused by the heat. And at the same time he heat radiating means would not give an influence of the stress to the semiconductor chip 2 caused by a deformation of itself.

Figure 20:
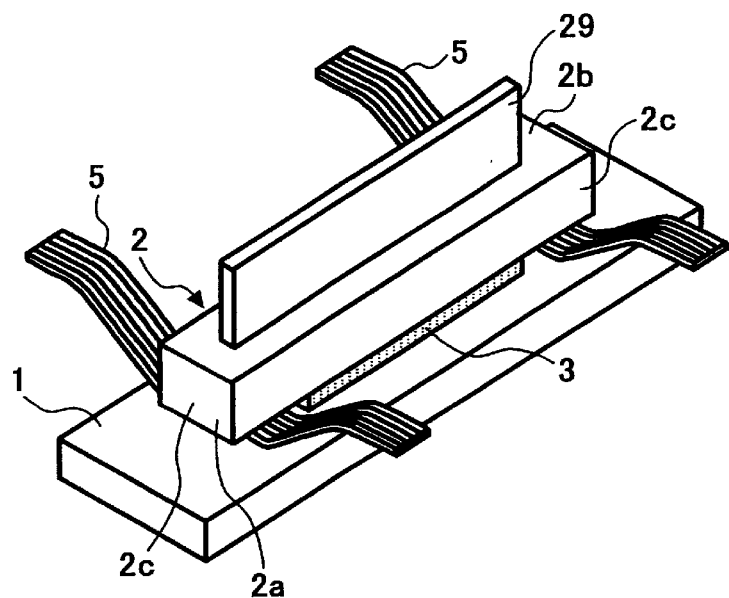
FIG. 20 is a perspective view to show still other modified example of a beat radiating means for the semiconductor device illustrated in FIG. 12.

FIG. 20 is a perspective view to show still other modified example of a heat radiating means for the semiconductor device illustrated in FIG. 12.

As shown in FIG. 20 the semiconductor device is different only in the heat radiating means from the semiconductor device of the embodiment 5 shown in FIG. 12 and the other structure is quite the same as the semiconductor device of embodiment 5.

The heat radiating means 29 is made to be in a plate shape and disposed to stand on the back surface 2b of semiconductor device 2. And the heat radiating means 29 is made of a selected material which has a thermal expansion coefficient near to that of the semiconductor device 2. Because the beat radiating means 29 which has the thermal expansion coefficient near to that of the semiconductor device, is arranged along the longer direction of the semiconductor device 2, the heat radiating means 29 expands and contracts equally corresponding to the expansion and contract of the semiconductor device 2 along the longer direction which is caused by a heat generation. By this arrangement the heat radiating means 29 would not influence to the expansion and the contraction of the semiconductor device 2. And at the same time the expansion and the contraction of the heat radiating means 29 would not influence on the semiconductor chip 2. By this arrangement the semiconductor chip 2 and the substrate 1 are made to be free from the thermal stress other than caused by themselves, and thereby they are free from deformation by an external force. Because of this fact the heat radiating means 29 would not give a stress to the semiconductor device 2 and it can increase the heat releasing effect.

The heat radiating means 29 is shown in FIG. 29 to be disposed in a state that the longer axes of heat radiating means 29 is parallel to that of the semiconductor device 2, however, it can be disposed in perpendicular or with random angle to the semiconductor device 2.

By the way according to need the above described heat radiating means may have larger surface area or a plurality of heat radiating means may be disposed it may be adequately designed with consideration of an amount of heat generation by the semiconductor device 2 and the heat releasing effect by the heat radiating means.

Also any one of heat radiating means 21–29 shown in FIG. 12 to FIG. 20 can be applicable to the semiconductor device of embodiment 2 shown in FIG. 6 and FIG. 7, the semiconductor device of embodiment 3 shown in FIG. 8 and FIG. 9 and the semiconductor device of embodiment 4 shown in FIG. 11.

Also any one of heat radiating means shown in FIG. 12 to FIG. 20 can be applicable to the back surface 17b in the solid state image forming device 17 as a semiconductor device for solid state image forming apparatus shown in FIG. 10.

And the semiconductor device shown in FIG. 1 to FIG. 9 and FIG. 11 to FIG. 20 can be replaceable with the solid state image forming device shown in FIG. 10. However, in this case it is necessary that a light transparent substrate is used and the optical functional surface 17a of solid state image forming device is covered with the adhesive material or optical functional surface 17a of solid state image forming device is not covered by the adhesive material at all as described in FIG. 10. For example, when the semiconductor device shown in FIG. 6 to FIG. 11 are made to be the solid state image forming device, the optical functional surface 17a not have to be covered by the adhesive material.

And when the semiconductor device shown in FIG. 3 to FIG. 6 and FIG. 12 to FIG. 20 are made to be the solid state image forming device, the optical functional surface 17a can be made not to be covered by the adhesive material by means of covering all the optical functional surface 17a by the adhesive material or arranging the adhesive material at least a part of circumference of the optical functional surface 17a.

The above described adhesive material 3 may be the photo curing type adhesive material or the heat curing type adhesive material, the curing temperature of heat curing type adhesive material must be lower than a temperature which breaks a junction between the power supplying means 5 and the semiconductor device 2.

When the heat curing type adhesive material is used as the adhesive material 3, the process for curing the adhesive material can be performed in even a portion to which light cannot reach. Because the curing temperature for the heat curing type adhesive material is selected at a predetermined-temperature that is lower than a temperature that breaks the conjunction of the assembly 100 which electrically connects the semiconductor chip 2 with the wiring portion 6 of the substrate 1, the power supplying means 5 and the semiconductor chip 2 can be connected and fixed with maintaining a reliability of the electrical conjunction without occurrence of breakage of the conjunction.

Further when the photo curing type adhesive material is used as the adhesive material 3, semiconductor chip 2 and the substrate 1 can be adhered to fix without any discrepancy of holding position due to thermal expansion because a rise in temperature would not almost occur when the adhesive material is cured by a light. Also it does never happen a residual stress influenced by a temperature change in the adhering process.

At this point the surface area of the above described the adhesive material 3 and the adhesive material 9 may be as small as that object to be adhered is not peeled off by its weight or an external force. The semiconductor chip 2 may be fixed by means that the adhesive material 3 and the adhesive material 9 are disposed only at small portion of the semiconductor chip 2 in vicinity of its middle of the surface. As described above when a longer semiconductor chip is used, the adhesive material may be disposed shortly in its longer direction. By this arrangement an occurrence of the curvature caused by a difference of thermal expansion coefficient between the semiconductor chip and the substrate can be prevented. Especially when the semiconductor chip is a solid state image forming device, out focus of the image forming light which comes in from the light transparent substrate to the solid state image forming device.

In accordance with the embodiment shown in any one of FIG. 3 to FIG. 20, the semiconductor device includes an assembly 100 in which a semiconductor chip 2 (solid state image forming device) having a functional surface (optical functional surface 17a) at a front surface and a power supplying means 5 are electrically connected at the functional surface, and characterized by that the assembly is disposed on a substrate 1 (1A) with the power supplying means side being the substrate side, the power supplying means has a pinched portion 7 between the semiconductor device and the substrate, and the substrate 1 (1A) and the semiconductor device 2 (solid state image forming device 17) are fixed together at a portion other than the pinched portion 7, and when the semiconductor chip 2 (solid state image forming device 17) and the substrate 1 (1A) make a expansion and contraction under influence by heat, the electrically connected portion between the semiconductor chip 2 (solid state image forming device 17) and the power supplying means 5 moves quite the same as the p-s portion of semiconductor chip 2 (solid state image forming device 17), and it is not affected by the movement of the substrate 1 (1A). Because of this any stress is not applied to the electrical connected portion and thereby breakage of the electrical connected portion can be prevented.

Also the semiconductor chip 2 (solid state image forming device 17) and the substrate 1 (1A) are fixed by only the adhesive material 3 and the surface are of adhered points can be reduced as much as possible for the object to be adhered not to peel off by its weight or an external force. By this arrangement when the semiconductor chip 2 (solid state image forming device 17) and the substrate 1 (1A) make the expansion and contraction under influence of heat, because the movement of semiconductor chip 2 (solid state image forming device 17) is not affected by that of the substrate 1 (1A), unnecessary force is not loaded to the semiconductor chip 2 (solid state image forming device 17) and the curvature does not happen in the semiconductor chip 2 (solid state image forming device 17), a discrepancy in optical positional relation of the semiconductor chip 2 (solid state image forming device 17) as an optical device does not occur, since, optical characteristics of the system is not changed.

In accordance with any one of the embodiment shown in FIG. 12 to FIG. 20, the semiconductor device includes an assembly 100 in which a semiconductor chip 2 having a functional surface at a front surface and a power supplying means 5 are electrically connected at the functional surface, and characterized by that the assembly is disposed on a substrate 1 with the power supplying means side being the substrate side, the power supplying means has a pinched portion 7 between the semiconductor device and the substrate, and the substrate 1 and the semiconductor device 2 are fixed together at a portion other than the pinched portion 7, and when the semiconductor chip 2 and the substrate 1 make a expansion and contraction under influence by heat, the electrically connected portion between the semiconductor chip 2 and the power supplying means 6 moves quite the same as the p-s portion of semiconductor chip 2, and it is not affected by the movement of the substrate 1. Because of this any stress is not applied to the electrical connected portion and thereby breakage of the electrical connected portion can be prevented. At the same time because the heat radiating means 21–29 is arranged, heat which is generated in the semiconductor chip 2 can be effectively released to environment, the thermal deformation of semiconductor chip 2 can be prevented.

Also the semiconductor chip 2 and the substrate 1 are fixed by only the adhesive material 3 and the surface are of adhered points can be reduced as much as possible for the object to be adhered not to peel off by its weight or an external force. By this arrangement when the semiconductor chip 2 and the substrate 1 make the expansion and contraction under influence of heat, because the movement of semiconductor chip 2 is not affected by that of the substrate 1, unnecessary force is not loaded to the semiconductor chip 2 and the curvature does not happen in the semiconductor chip 2, a discrepancy in optical positional relation of the semiconductor chip 2 as an optical device does not occur, since, optical characteristics of the system is not changed.

Hereinafter an explanation will be given on the embodiment shown in FIG. 8 and FIG. 9. In the embodiment the substrate 1 is a ceramic substrate, the semiconductor chip 2 is a silicon substrate on which an arithmetic circuit is formed, and the power supplying means 5 is a flexible substrate. The arithmetic circuit and the flexible substrate are bonded in face down bonding as shown in FIG. 8, the assembly is adhered onto the ceramics substrate. The driving power, input and output signals are exchanged with environment through the flexible substrate.

At this point when the temperature around the system is getting raise under the influence of environment or driving heat at the arithmetic circuit, the silicon substrate and the ceramics substrate begin to expand based on their own thermal expansion coefficient. Herein because of difference between thermal expansion coefficient between the ceramics substrate and the silicon substrate on which the arithmetic circuit is formed, the amount of expansions for those are different.

Though ceramics and silicon are told that the thermal expansion coefficients for them are resemble and they are hard to be influence by thermal expansion, when a dimension of the silicon substrate becomes large, a small difference of thermal expansion coefficient appears large in absolute value of difference of expansion and there is a possibility that it makes large effect.

Generally ceramics has a large thermal expansion coefficient and shows large amount of expansion. At this point when the conjunction portion between the silicon substrate and the flexible substrate is fixed on the ceramics substrate, the conjunction portion is drown out because the conjunction portion is fixed and the stress is concentrated at the conjunction portion, thereby a breakage of the conjunction portion is resulted. However in the present invention, the conjunction portion is not fixed on the ceramics substrate then the stress caused by thermal expansion of the ceramics substrate is not loaded on it, breakage of conjunction portion is prevented.

Due to this fact a necessity that thermal expansion coefficient for substrate 1 must be resemble to that of the semiconductor chip 2 (silicon), arbitrary material such as molded plastic, metal, ceramics, glass and so on can be selected as the substrate 1 in the present invention.

Hereinafter explanation of another embodiment will be given.

In the embodiment the light transparent substrate 1 is a glass substrate, the solid state image forming device 17 is a silicon substrate on which a line CCD is formed, and the power supplying means 5 is a flexible substrate. The substrate and the silicon substrate on which the line CCD is formed are bonded in face down bonding as shown in FIG. 10, the assembly is adhered onto the glass substrate. Incident light is introduced to the line CCD through the glass substrate, the electrical signals which is made by photoelectric conversion are output through the flexible substrate. The glass substrate works as not only protection means for the line CCD but also holding means of the line CCD.

At this point when the temperature around the system is getting raise under the influence of environment or driving heat at the line CCD, the silicon substrate and the glass substrate begin to expand based on their own thermal expansion coefficient. Herein because of difference between thermal expansion coefficient between the glass substrate and the silicon substrate on which the line CCD is formed, the amount of expansions for those are different.

Generally glass has a larger thermal expansion coefficient and shows large amount of expansion. At this point when the conjunction portion between the silicon substrate and the flexible substrate is fixed on the glass substrate, the conjunction portion is drown out because the conjunction portion is fixed and the stress is concentrated at the conjunction portion, thereby a breakage of the conjunction portion is resulted. However in the present invention, the conjunction portion is not fixed on the glass substrate then the stress caused by thermal expansion of the glass substrate is not loaded on it, breakage of conjunction portion is prevented.

In the embodiment above glass is selected as substrate 1, however, as far as it is transparent material plastics and sapphire can be applicable under a restriction that the optical characteristics required by CCD must be satisfied.

In the embodiment above described, a flexible substrate which has flexibility is utilized as the power supplying means 5, however, it is not restricted in that and hard power supplying means (printed circuit board) can be applicable.

However, it is preferable that the power supplying means has minimum size required for electrical conjunction in the longer direction of the semiconductor chip 2. Especially for the case that the semiconductor chip 2 is the line CCD having a enough length in its longer direction, when the power supplying means 5 which has much longer length is fixed with the semiconductor chip 2, (for example two power supplying means sown in FIG. 3 is made in one body), the difference of amount in thermal expansion comes to remarkable and the conjunction portion is broken. For this problem rigidity of power supplying means 5 is also concerning and harder the substrate severer the result in such as printed circuit board. As a result of this it is preferable that the power supplying means 5 should have minimum length in longer direction of the semiconductor chip 2.

When the flexible substrate is utilized for the power supplying means 5 in the present invention, the substrate 1 and the power supplying means 5 may be fixed at the portion other than pinched between the semiconductor chip 2 and the substrate 1 in the embodiment that includes the pinched portion which is made between the semiconductor device and the substrate and is not fixed with the substrate 1. However, when the power supplying means 5 is made of hard material such as printed circuit board, it is necessary that both pinched portion 7 and portion other than pinched portion 7 are not fixed with the substrate 1.

Herein in the above described embodiment the semiconductor chip 2 and power supplying means 6 are bonded in flip chip bonding method, however, it is not restricted in that and in the assembly 100 the semiconductor chip 2 may be bonded in wire bonding method.

With regard to the adhesion by the adhesive material 3, when the semiconductor chip 2 has a longer dimension such as the line CCD, and the adhering portion is wide and large, an inner circuitry of the semiconductor chip 2 may be broken because of expansion and contraction of the substrate though the conjunction portion is not still broken. In such case the countermeasures to solve the problem are, for example that the adhesive material 3 is put only a small portion near the central portion of the semiconductor chip or softer adhesive material is used not to transfer the expansion and contraction to the semiconductor chip 2.

Though in the above described embodiment the semiconductor chip with elongated shape such as the line CCD, is only mentioned, however, the present invention is intended to include not only the elongated shape but such as a square, a polygonal, a circular and so on of all the shapes of semiconductor chip.

Figure 21:
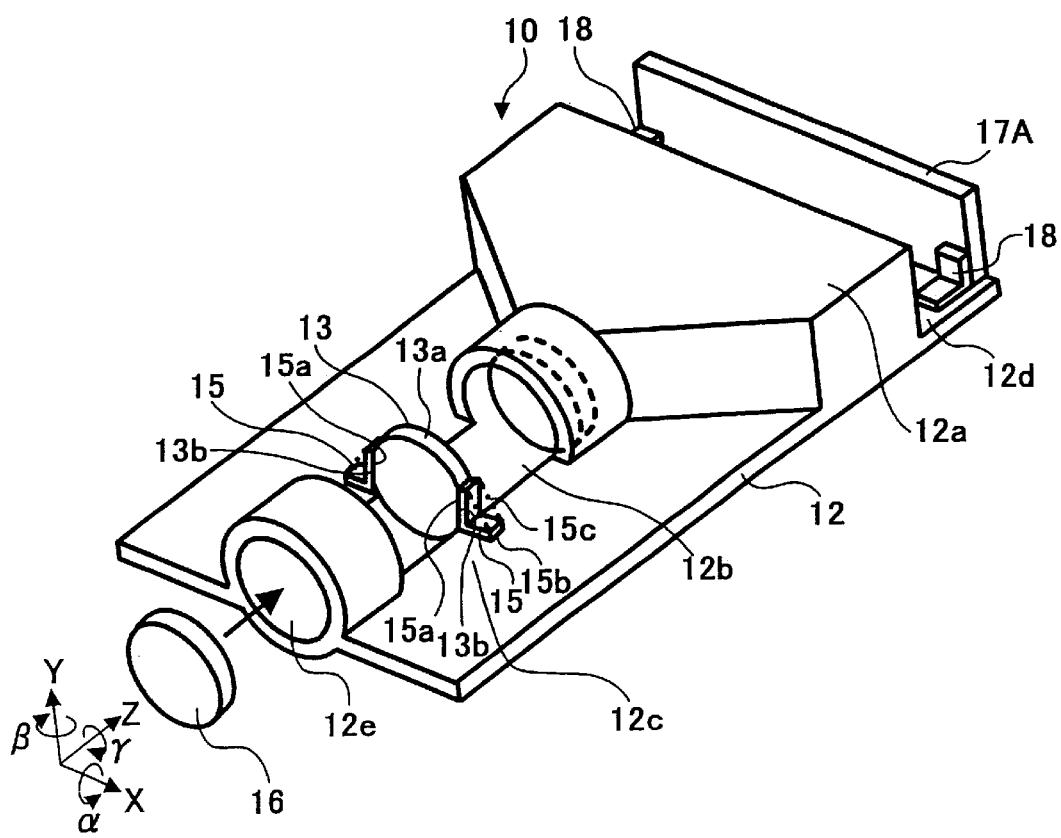
FIG. 21 is a perspective view to show an image scanning unit utilizing a solid state image forming device composed of the semiconductor device according to the present invention.

As shown in FIG. 21 the image scanning unit 10 utilizing the above described solid state image forming device includes: a lens 13 as an optical element having an edge surface 13a as an side edge of the lens around a light passing surface including a light axis along which light as an image forming light from a manuscript surface of a material to be copied; an intermediate holding member 15 having a first attaching surface 15a which is opposed to the edge surface 13a and a second attaching surface which is arranged to have a different angle from the first attaching surface, in this embodiment an angle perpendicular to the first attaching surface, and connecting between the lens 13 and a housing 12; and the housing 12 as a base member having a attaching surface 12c which is opposed to the second attaching surface. In the image scanning unit 10 the housing 12 and the lens 13 which is arranged to have adjusted in positional condition relative to the housing 12 are adhered and fixed through the intermediate holding member 15.

The above described lens 13 includes two flat surfaces 13b which are arranged in the same diameter on the edge surface 13a. The flat surfaces 13b are made by a cutting process or a grinding process and so on and rubbed when it is required. By making the flat surface 13b as described above, a surface area to be adhered with the first attaching surface 16a of intermediate holding member 15 can be expanded and thereby a strength of fixing can be enhanced.

The above described housing 12 is arranged to fix the lens 13 and solid state image forming device 17A in a adjusted position after they are adjusted relatively in a predetermined positional condition. The housing 12 includes: circular groove portion 12b; flat attaching surface 12c which is adjacent to the circular groove portion 12b; an attaching surface 12d onto which the solid state image forming device is attached; an image forming lens unit which is composed of the lens 13 and 16; and a light shielding cover 12a which makes light shielding between the image forming lens unit and the solid state image forming device 17A. By including the light shielding cover 12a, an influence of disturbance from the outside light can be prevented and clear image can be obtained. The housing 12 is fixed at a predetermined position onto an image scanning apparatus which will be described later by fixing means of screwing, caulking, adhering, welding and so on.

The above described intermediate holding member 16 is made of a material with high light (ultraviolet) transmittance, for example ARTON (Trade name by JSR Corp.), Zeonex (Trade name by Zeon Corp.), polycarbonate and so on.

When the position of the lens is moved for positional adjustment of the lens, the above described intermediate holding member 15 slidably moves at the both adhering surface by a surface tension of the adhesive material and follows the movement of lens 13.

By the arrangement that the first attaching surface 16a and the second attaching surface 15b of the above described intermediate holding member 15, that is to say the both attaching surfaces, are arranged to cross at right angle, the positional adjustment of lens 13 becomes possible in a six axes and along respective adjustment axes the adjustment can be independently performed.

By the arrangement in that the two flat surfaces 13b at edge surface 13a of the lens 13 as the adhering surfaces in the optical element are opposed together utilizing the two intermediate holding member 16, an influence of shrinkage when the adhesive material is cured can be reduced.

By the arrangement in that a light transparent rib 15c is disposed between the both adhering surfaces of the intermediate holding member 15 as shown in FIG. 13, a strength of the intermediate holding member 16 can be increased without increasing a loss of light when the photo curing type adhesive material is cured.

Because the first attaching surface 15a which is the adhering surface for the lens of the above described intermediate holding member 15 and the second attaching surface 16b which is the adhering surface for the intermediate holding member, are arranged to cross in the right angle, the positional adjustment can be independently performed in respective X, Y, Z, α, β and γ adjusting directions of the lens.

When thinking about a case in which the intermediate holding member 15 is connected and fixed with the lens 13 and the housing 12 by means of the photo curing type adhesive material, the lens 13 and the intermediate holding member 15 have the positional adjustment with a sliding movement on a housing attaching surface 12c as a fixing surface for holding member side of the housing 12 when they are adjusted along the X and Z direction.

And when they are adjusted along the Y direction, the moving lens 13 has the positional adjustment with a sliding movement on the first attaching surface 15a as a fixing surface for the lens the intermediate holding member 15.

And they are adjusted along the α, β and γ directions in the similar manner. Further, because the optical element has a spherical shape having the optical axis as its center when in a case the optical element is lens, a discrepancy in the optical axis which is caused by an accidental error happened in the manufacturing process cannot be adjusted by a rotation around the optical axis (γ axis) and it is merely rotated. In this context the adjustment around the γ axis is not required.

Figure 22:
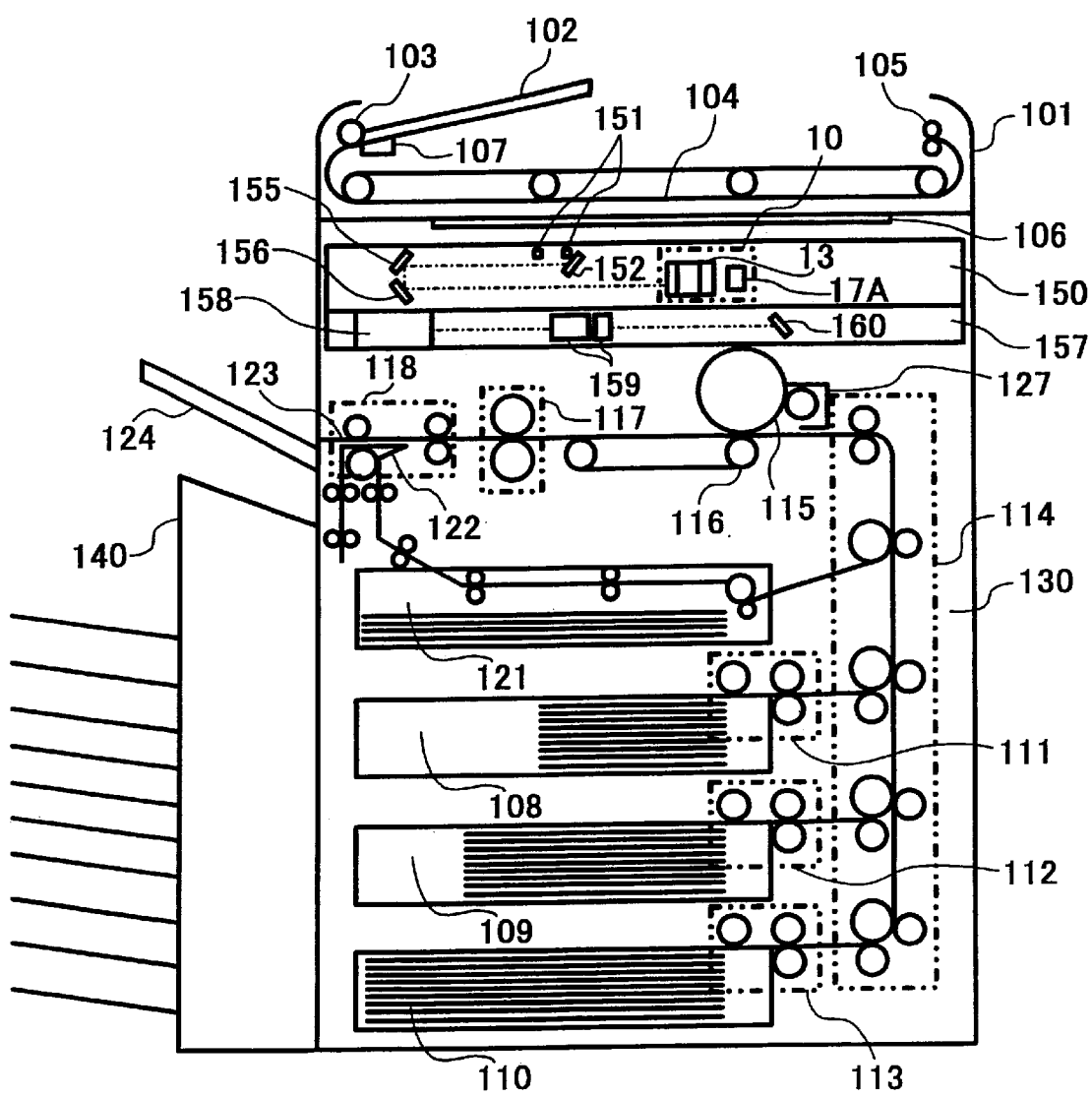
FIG. 22 is a schematic perspective view to show a multi function type digital image forming apparatus as one example of the image scanning apparatus composed of an image scanning unit utilizing a solid state image forming device as a semiconductor device according to the present invention.

FIG. 22 is a schematic perspective view to show a multi function type digital image forming apparatus as one example of the image scanning apparatus composed of an image scanning unit utilizing a solid state image forming device as a semiconductor device according to the present invention.

As shown in FIG. 22 this image data input apparatus is composed of including automatic document supplier 101, image scanning unit 150, image data writing unit 157, paper supplying unit 130 and post-processing unit 140.

The automatic document supplier 101 supplies automatically a document onto a contacting glass 106 of the image scanning unit 150, and discharges automatically the document which has been read over.

The image scanning unit 150 illuminates the document set on the contacting glass 106 and read the optical information by solid state image forming device 17A which is photo-electric transforming device, the image data writing unit 157 forms an image data on a photosensitizer 115 corresponding to the image data signal which is input from the document read, and transfers it and fixes onto a paper supplied by the paper supplying unit 130. The transferred paper which has been completed all the process is discharged to the post-processing unit 140, and required post-process is achieved such as sorting or stapling.

The image scanning unit 150 comprises the contacting glass 106 and the optical scanning system, which includes an exposing lamp 161, a first mirror 152, lens 13, solid state image forming device 17A, a second mirror 166 and a third mirror 156. The exposing lamp 161 and the first mirror 152 are fixed on a first carriage which is not shown in the drawing, the second mirror 155 and the third mirror 156 are fixed on a second carriage which is also not shown in the drawing.

The first and second carriages are moved mechanically to scan with relative velocity in a ratio of two to one (2:1) in order not to change a length of the light path. The optical scanning system is driven by a scanner driving motor which is not shown in the drawing.

The image data on the document to be copied is read by the solid state image forming device 17A, and optical signal of the image data are transformed into electrical signal in order to be processed. When the lens 13 and the CCD solid state image forming device are moved in the left and right direction of the drawing, the magnification rate of the image can be altered. That is to say, the position of the lens 13 and the CCD solid state image forming device in the left and right direction is set in accordance with the predetermined magnification rate.

The writing unit 157 is composed of laser output unit 168, image focusing lens 169 and a mirror 160, a set of laser diodes which are light sources of laser, and polygon mirror which is driven to rotate in high and constant velocity by a motor, are set up in the laser output unit 158.

The laser light beam irradiated from the laser output unit 168 is reflected and changed its direction by the above described polygon mirror which is rotated in constant velocity, passes through the image focusing lens 159, and it is reflected by the mirror 160 to be focused on surface of the photosensitizer. The reflected laser light beam is scanned for exposure in, what is called, main scanning direction which is perpendicular to a rotating direction of the photosensitizer 115, the image data signal are output in an unit of every line from a MSU 606 of the image processing unit. By a repetition of the main scanning in a predetermined period which corresponds to a recording density and rotating velocity of the photosensitizer, an image is formed on the photosensitizer as an electrostatic latent image.

As above described, the laser light beam output from the writing unit 157 is irradiated onto the photosensitizer 115 of an image forming system, a beam sensor which generates a synchronizing signal and is not shown in the drawing, is disposed at irradiated area by one side of the photosensitizer 115. The signal which is output from this beam sensor is a main scanning synchronizing signal and controlling of recording timing for image data and generation of controlling signal for input/output of the image data signal are achieved based on this main scanning synchronizing signal.

The present invention should not be understood that it is limited only to the above described example of embodiment. It can be brought to an implementation in various different manners without departing from spirit of the invention.

As above described in accordance with the present invention the following effects can be attained.

It can prevent the breakage of electrical conjunction portion between the semiconductor chip and the power supplying means can be prevented because stress is not loaded on the conjunction portion. There is no necessity to consider the thermal expansion coefficient of the substrate, thereby freedom of selection of material used for the substrate is largely expanded.

It can prevent the local breakage of between the semiconductor chip and the substrate.

It can prevent the local breakage of between the semiconductor chip and the substrate and at the same time it can prevent the occurrence of parasitic capacitance and when the semiconductor chip device is an optical device, bubbles or impurities in the adhesive material does not block off the light path.

At the same time the adhesive material is prevented to flow out and thereby the adhesive material is prevented to enter into the space between the surfaces and the substrate by the flowing out of the adhesive material. Also because the initial form of adhesive material can be kept in and thereby the arrangement of adhesive material can be easily performed.

Further the adhesive material has enough strength against internal and external pressure even before it is hardened. Also the production is easily performed.

The adhesive strength can be made higher because an adhering area between the adhesive material and the semiconductor chip and the substrate can be taken wider.

The adhesive material would not wraparound between the functional surface of semiconductor and the substrate because the flowing out of adhesive material can be prevented effectively even when the adhesive material with low viscosity is utilized. The adhesive material with low viscosity can be used as the adhesive material.

It can hold the adhesive material by supporting means made by sponge like material.

It can hold the adhesive material by supporting means made by aggregated body of fiber.

The photo curing type adhesive material can be used because whole surface of the held adhesive material is irradiated by a hardening light through the adhesive material supporting body.

The light incident to (or going out from) the semiconductor chip is not blocked by the bubble or impurities in the adhesive material, thereby the problem that the performance of semiconductor chip as an optical device is deteriorated would not occur.

The semiconductor chip and the substrate can be adhered to fix without any discrepancy of holding position due to thermal expansion because a rise in temperature would not almost occur when the adhesive material is cured by a light. Also it does never happen a residual stress influenced by a temperature change in the adhering process.

The adhesive material can be cured by a heat by means of utilizing a heat curing type adhesive material even where the portion can not be irradiated by a light. Because the curing temperature for the heat curing type adhesive material is selected at a predetermined temperature that is lower than a temperature that breaks the conjunction of the assembly which electrically connects the semiconductor chip with the wiring portion of the substrate, the substrate and the semiconductor chip can be connected and fixed with maintaining a reliability of the electrical conjunction without occurrence of breakage of the conjunction.

The semiconductor chip can give effectively away the heat generated in the semiconductor chip to environment because the adhesive material does not cover an opposite surface of the semiconductor functional surface and at the same time it has a merit that there are no need to add the h-r part.

The breakage of conjunction portion between the semiconductor device and the power supplying means can be prevented because stress is not loaded on the electrical conjunction portion. Further because it has heat radiating means it can effectively release the generated heat from the semiconductor device and thereby deformation of the semiconductor device can be restricted.

The heat radiating means can have the elasticity along an expansion and a contraction direction of the semiconductor chip even when the heat radiating means are made of a hard material.

To the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device.

The light incident to (or going out from) the solid state image forming device is not blocked by the bubble or impurities in the adhesive material, thereby the problem that the performance of semiconductor chip is deteriorated would not occur.

Because the contacted portion between the solid state image forming device and the power supplying means is made free from breakage by heat and the incident light to the solid state image forming device is not blocked off and the performance of solid state image forming device can be carried out sufficiently, there is no possibility of occurrence of error in reading the image data and thereby the image scanning unit with high reliability can be provided.

Because the contacted portion between the solid state image forming device and the power supplying means is made free from breakage by heat and the performance of solid state image forming device can be carried out sufficiently, there is no possibility of occurrence of error in reading the image data and because the image forming apparatus includes the image forming unit which can carry out the image forming with high reliability, the apparatus can form electrostatic latent image with high accuracy thereby there is no possibility of occurrence of error in reading the image of the manuscript.

What is claimed is:

1. semiconductor device comprising:
    a substrate;
    an assembly including a semiconductor chip having a functional surface at a front surface of said semiconductor chip and a power supplying unit electrically connected to said functional surface, wherein said assembly is disposed on said substrate such that said power supplying unit faces the substrate; and an adhesive material configured to fix said semiconductor chip and said substrate, wherein
said power supplying unit has a pinched portion between said semiconductor device and said substrate,
said substrate and said semiconductor device are fixed together at a portion other than said pinched portion, and
said adhesive material which adheres said semiconductor chip and said substrate is filled at a space between said substrate and said functional surface of said semiconductor chip.

2. The semiconductor device according to claim 1, wherein said adhesive material which adheres said semiconductor chip and said substrate contacts said substrate and a back surface of said semiconductor chip.

3. The semiconductor device according to claim 1, wherein said adhesive material which adheres said semiconductor chip and said substrate contacts at least one surface other than both of a front surface and a back surface of said semiconductor chip.

4. The semiconductor device according to claim 3, wherein said adhesive material is held by an adhesive material holding member.

5. The semiconductor device according to claim 4, wherein said adhesive material holding member is made of a sponge like material.

6. The semiconductor device according to claim 4, wherein said adhesive material holding member is made of an aggregated body of fibers.

7. The semiconductor device according to claim 4, wherein said adhesive material holding member has a light transparent property.

8. The semiconductor device according to claim 1, wherein said adhesive material is covered with a cured adhesive material.

9. The semiconductor device according to claim 8, wherein a cross section of said cured adhesive material is circular.

10. The semiconductor device according to claim 8, wherein a cross section of said cured adhesive material is polygonal.

11. The semiconductor device according to claim 1, wherein said substrate is made of a light transparent material, said semiconductor chip has an optical functional surface and a space is formed between the optical functional surface and said light transparent substrate as a light incident space.

12. The semiconductor device according to claim 11, wherein said semiconductor chip is a solid state image forming device.

13. The semiconductor device according to claim 1, wherein said adhesive material is a photo curing type adhesive material.

14. The semiconductor device according to claim 1, wherein said adhesive material is a heat curing type adhesive material having a curing temperature lower than a temperature that breaks a junction of said assembly.

15. The semiconductor device according to claim 1 further comprising a fixing member which fixes said assembly on said substrate, wherein said fixing member has a heat radiating member.

16. semiconductor device comprising:
a substrate;
an assembly including a semiconductor chip having a functional surface at a front surface of said semiconductor chip and a power supplying unit electrically connected to said functional surface, wherein said assembly is disposed on said substrate such that said power supplying unit faces the substrate; and
a heat radiating member that radiates heat and is disposed at a back surface of said semiconductor chip, wherein
said power supplying unit has a slidably pinched portion between said semiconductor device and said substrate, and
said substrate and said semiconductor device are fixed together at a portion other than said pinched portion.

17. The semiconductor device according to claim 16, wherein an adhesive material which fixes said semiconductor chip and said substrate is filled at a space between said substrate and the functional surface of said semiconductor chip.

18. The semiconductor device according to claim 16, wherein said adhesive material which adheres said semiconductor chip and said substrate contacts said substrate and a back surface of said semiconductor chip.

19. The semiconductor device according to claim 16, wherein said adhesive material which adheres said semiconductor chip and said substrate contacts at least one surface other than both of a front surface and the back surface of said semiconductor chip.

20. The semiconductor device according to claim 19, wherein said adhesive material is covered with a cured adhesive material.

21. The semiconductor device according to claim 20, wherein a cross section of said cured adhesive material is circular.

22. The semiconductor device according to claim 20, wherein a cross section of said cured adhesive material is polygonal.

23. The semiconductor device according to claim 19, wherein said adhesive material is held by an adhesive material holding member.

24. The semiconductor device according to claim 23, wherein said adhesive material holding member is made of a sponge like material.

25. The semiconductor device according to claim 23, wherein said adhesive material holding member is made of an aggregated body of fibers.

26. The semiconductor device according to claim 23, wherein said adhesive material holding means member has a property of being light transparent.

27. The semiconductor device according to claim 16, wherein said substrate is made of a light transparent material, said semiconductor chip has an optical functional surface and a space is formed between the optical functional surface and said light transparent substrate as a light incident space.

28. The semiconductor device according to claim 16, wherein said adhesive material is a photo curing type adhesive material.

29. The semiconductor device according to claim 16, wherein said adhesive material is a heat curing type adhesive material having a curing temperature lower than a temperature that breaks a junction of said assembly.

30. The semiconductor device according to claim 16, further comprising a fixing member which fixes said assembly on said substrate, wherein said fixing member has a heat radiating member.

31. The semiconductor device according to claim 16, wherein said heat radiating means member is made of an elastic member which performs an elastic deformation according to a thermal deformation of said semiconductor chip along a direction of the functional surface of said semiconductor chip.

32. The semiconductor device according to claim 31, wherein said elastic member is a wave like member which is formed in a wave like shape.

33. The semiconductor device according to claim 31, wherein said elastic member is a spiral like member which is formed in a spiral shape.

34. The semiconductor device according to claim 16, wherein said heat radiating member is a wire like member which is formed in a wire like shape.

35. The semiconductor device according to claim 16, wherein said heat radiating member is a spike like member which is formed in a spike like shape.

36. The semiconductor device according to claim 16, wherein said heat radiating member is a spherical member which is formed in a spherical shape.

37. The semiconductor device according to claim 16, wherein said heat radiating member is made of a material which has a thermal expansion coefficient similar to that of said semiconductor device.

38. The semiconductor device according to claim 16, wherein said semiconductor chip is a solid state image forming device.

39. An image scanning unit, comprising:
   a semiconductor device, said semiconductor device including
      a substrate;
      an assembly including a semiconductor chip having a functional surface at a front surface of said semiconductor chip and a power supplying unit to which said functional surface is electrically connected, said assembly being disposed on said substrate such that said power supplying unit faces the substrate; and
      an adhesive material that fixes said semiconductor chip and said substrate,
   wherein
      said power supplying unit has a pinched portion between said semiconductor device and said substrate,
      said substrate and said semiconductor device are fixed together at a portion other than said pinched portion, and
      said adhesive material which adheres said semiconductor chip and said substrate is filled at a space between said substrate and said functional surface of said semiconductor chip.

40. An image forming apparatus, comprising:
   an image scanning unit; and
   a semiconductor device, said semiconductor device including
      a substrate;
      an assembly including a semiconductor chip having a functional surface at a front surface of said semiconductor chip and a power supplying unit to which said functional surface is electrically connected, said assembly being disposed on said substrate such that said power supplying unit faces the substrate; and
      an adhesive material that fixes said semiconductor chip and said substrate,
   wherein
      said power supplying unit has a pinched portion between said semiconductor device and said substrate,
      said substrate and said semiconductor device are fixed together at a portion other than said pinched portion, and
      said adhesive material which adheres said semiconductor chip and said substrate is filled at a space between said substrate and said functional surface of said semiconductor chip.

* * * * *